(12) United States Patent
Fukushima et al.

(10) Patent No.: US 10,651,846 B2
(45) Date of Patent: May 12, 2020

(54) DRIVER CIRCUIT AND SWITCHING REGULATOR

(71) Applicant: Rohm Co., Ltd., Kyoto (JP)

(72) Inventors: Shun Fukushima, Kyoto (JP); Kazuhiro Murakami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/261,810

(22) Filed: Jan. 30, 2019

(65) Prior Publication Data
US 2019/0238129 A1    Aug. 1, 2019

(30) Foreign Application Priority Data

Feb. 1, 2018   (JP) .................................. 2016-016214

(51) Int. Cl.
| | | |
|---|---|---|
| *H03K 17/687* | (2006.01) | |
| *H02M 7/537* | (2006.01) | |
| *H02M 3/158* | (2006.01) | |
| *H02M 1/08* | (2006.01) | |

(52) U.S. Cl.
CPC .......... *H03K 17/6872* (2013.01); *H02M 1/08* (2013.01); *H02M 3/158* (2013.01); *H02M 7/537* (2013.01)

(58) Field of Classification Search
None
See application file for complete search history.

(56) References Cited

U.S. PATENT DOCUMENTS

| | | | |
|---|---|---|---|
| 5,218,239 A | 6/1993 | Boomer | |
| 10,027,325 B1* | 7/2018 | Graves | ........... H03K 19/018521 |
| 2007/0035180 A1* | 2/2007 | Jang | ..................... H03K 17/161 |
| | | | 307/112 |
| 2008/0061876 A1* | 3/2008 | Kaya | ...................... H03F 3/217 |
| | | | 330/207 P |
| 2015/0002408 A1* | 1/2015 | Mozak | ............... H04L 25/0276 |
| | | | 345/173 |
| 2016/0301309 A1* | 10/2016 | Tateishi | ................ H02M 3/158 |
| 2017/0070147 A1* | 3/2017 | Childs | ................... H02M 3/158 |

FOREIGN PATENT DOCUMENTS

| | | |
|---|---|---|
| JP | H06-296129 | 10/1994 |
| JP | 2016-073069 | 5/2016 |
| JP | 2017-121068 | 7/2017 |

* cited by examiner

*Primary Examiner* — Cassandra F Cox

(74) *Attorney, Agent, or Firm* — Fish & Richardson P.C.

(57) ABSTRACT

A driver circuit (DRV1) includes a pull-up circuit (PU1) and a pull-down circuit (PD1) that share an output node (external terminal (T3)). A signal (DI1 (DI2)) input to the pull-up circuit (PU1) and a signal (DI3) input to the pull-down circuit (PD1) are selected in a complementary manner, and the output node outputs an output signal in which rising time and falling time of the signals (DI1 (DI2) and DI3) are adjusted in accordance with on-off operation of the signals. The rising time is adjusted by transistors (M1 and M2) and a resistor (R1), while the falling time is adjusted by transistors (M3, M4 and M5) and a resistor (R2).

18 Claims, 10 Drawing Sheets

DRIVER CIRCUIT AND SWITCHING REGULATOR

CROSS-REFERENCE TO RELATED APPLICATIONS

This nonprovisional application claims priority under 35 U.S.C. § 119(a) on Patent Application No. 2018-016214 filed in Japan on Feb. 1, 2018, the entire contents of which are hereby incorporated by reference.

BACKGROUND OF THE INVENTION

Field of the Invention

The present invention relates to a driver circuit and a switching regulator.

Description of Related Art

A driver circuit is used as a gate driver that drives an output stage of a switching regulator such as a DC-DC converter or a DC-AC inverter.

JP-A-2017-121068 (hereinafter referred to as Patent Document 1) discloses a gate driver that does not need a gate resistor and can reduce power consumption. The gate driver of Patent Document 1 includes a drive controller and a gate driver. When the drive controller receives a control signal for switching the power transistor to a conduction state, it switches a drive signal from a first level to a second level, and after a first period elapses it switches the drive signal to the first level, and further it switches the same to the second level after a second period elapses. When receiving a control signal for switching the power transistor to a cut-off state, the drive controller switches the drive signal from the second level to the first level, and after a third period elapses it switches the drive signal to second level, and further it switches the same to the first level after a fourth period elapses. The gate driver amplifies the drive signal and outputs the same.

JP-A-2016-73069 (hereinafter referred to as Patent Document 2) discloses a power supply device and its control method in which power saving is realized and ringing noise of a switching element can be reduced. The power supply device of Patent Document 2 includes a battery to be a power source for drive power, a first switching element that performs on-off switching by a switching control voltage whose voltage value changes between a high voltage level and a low voltage level, so that its switch operation is controlled to transform an input voltage from the battery into a predetermined voltage, a second switching element that performs on-off switching by the switching control voltage whose voltage value changes between the high voltage level and the low voltage level, so that its switch operation is controlled to rectify an output of the first switching element to generate the drive power, and a control unit that outputs the switching control voltage to the first and second switching elements so that the first and second switching elements perform on-off switching. The control unit performs so-called variable slew rate control of at least one of the switching control voltages to the first and second switching elements, during a period in which a voltage level thereof is changed between the high voltage level and the low voltage level.

JP-A-6-296129 (hereinafter referred to as Patent Document 3) discloses a CMOS output buffer circuit that can select an edge speed. The circuit of Patent Document 3 is aimed at reduction of Electro Magnetic Interference (EMI) and Radio Frequency Interference (RFI) noise generated from the output buffer circuit. For this purpose, it selects different rising time and falling time of an output signal transition between a low potential level and a high potential level. The rising time and the falling time are selected in a digital manner. The circuit of Patent Document 3 includes at least one pull-down predriver resistor having a resistance selected so that turn-on speed of the output pull-down driver is reduced.

However, Patent Document 1 does not consider about reduction of ringing. In Patent Document 2, reduction of ringing is considered, but it is necessary to select a set vale from a setting table for the variable slew rate control, and it is difficult to automatically control. Further, a communication unit is necessary for communication between an electronic device and the drive controller, which causes a problem that a circuit scale is increased. In addition, the circuit of Patent Document 3 selects the rising time and the falling time in a digital manner, which causes a problem that a circuit structure is a little complicated.

SUMMARY OF THE INVENTION

The present invention is made to solve the problem described above, and it is an object of the present invention to provide a driver circuit and a switching regulator using the driver circuit, which can change slew rate in at least two steps instead of controlling it in a digital manner, with a very simple circuit structure.

In order to achieve the object described above, a driver circuit according to the present invention includes a pull-up circuit and a pull-down circuit that share an output node so as to output an output signal from the output node by on-off operation of complementary input signals. The pull-up circuit and the pull-down circuit are connected in series between a power supply terminal and a reference potential via the output node. At least one of the pull-up circuit and the pull-down circuit responds to each of rising and falling of the input signals with a first response and a second response. As a level at which the first response and the second response are switched, a threshold value voltage between gate and source of a MOS transistor or a forward voltage between base and emitter of a bipolar transistor is used.

Note that other features, elements, steps, advantages, and characteristics of the present invention will become more apparent from the description of the best mode embodiment given below and the related attached drawings.

DETAILED DESCRIPTION OF THE PREFERRED EMBODIMENTS

<First Embodiment of Driver Circuit>

Figure 1:
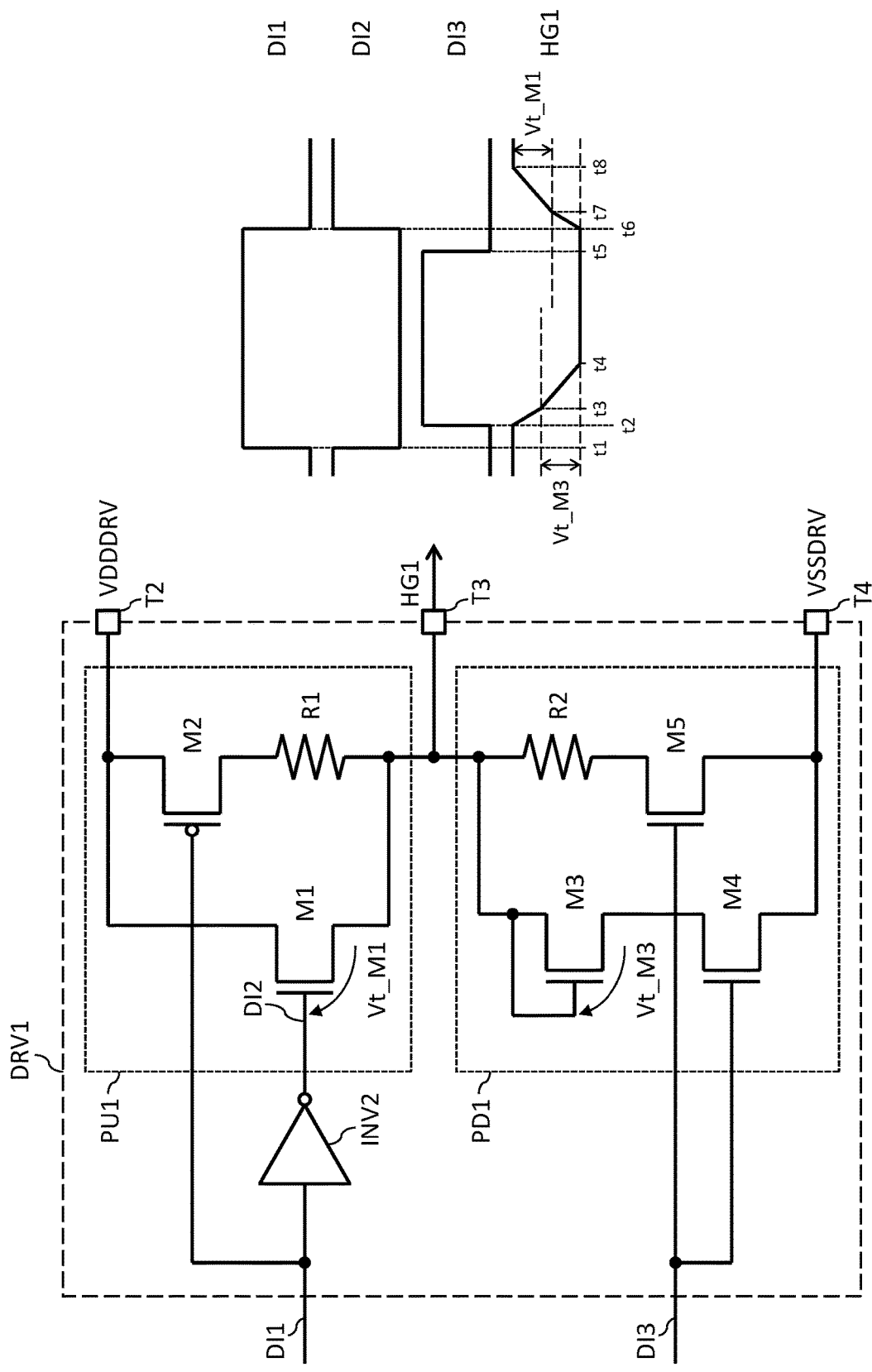
FIG. 1 is a circuit diagram of a first embodiment of a driver circuit according to the present invention.

FIG. 1 illustrates a first embodiment of a driver circuit according to the present invention. A driver circuit DRV1 includes a pull-up circuit PU1 and a pull-down circuit PD1. The pull-up circuit PU1 and the pull-down circuit PD1 share an external terminal T3 (output node) and are connected in series between an external terminal T2 applied with a power supply voltage VDDDRV of the driver circuit DRV1 and an external terminal T4 fixed to a reference potential VSSDRV of the driver circuit DRV1. The pull-up circuit PU1 pulls up a potential at the external terminal T3 to a potential at the external terminal T2. In addition, the pull-down circuit PD1 pulls down the potential at the external terminal T3 to a potential at the external terminal T4.

The pull-up circuit PU1 includes, for example, an NMOS type transistor M1, a PMOS type transistor M2, and a resistor R1. It is preferred that the transistors M1 and M2 be of a MOS type in view of power saving. However, the transistor M1 may be replaced by an NPN type bipolar transistor, and the transistor M2 may be replaced by a PNP type bipolar transistor. A signal DI1 is input to an input side of an inverter INV2 and a control electrode (gate) of the transistor M2. An output side of the inverter INV2 is connected to a control electrode (gate) of the transistor M1. A first main electrode (drain) of the transistor M1 is connected to the external terminal T2, and a second main electrode (source) thereof is connected to the external terminal T3. A first main electrode (drain) of the transistor M2 is connected to one terminal of the resistor R1, and a second main electrode (source) thereof is commonly connected with the first main electrode of the transistor M1 and is connected to the external terminal T2. The other terminal of the resistor R1 is commonly connected with the second main electrode of the transistor M1 and is connected to the external terminal T3. Therefore, a main conductive path (between source and drain) of the transistor M2 and the resistor R1 are connected in series between the external terminal T2 and the external terminal T3.

The resistor R1 has a function to make a resistance component value of the main conductive path of the transistor M2 be larger than that of the transistor M1. As another method without using the resistor R1, there is a method of decreasing a ratio W/L between a channel width W and a channel length L of the transistor M2. The resistance component value of the main conductive path becomes larger as the ratio W/L is made smaller, while it becomes smaller as the ratio W/L is made larger. Note that the resistor R1 can be considered as a part of the main conductive path of the transistor M2. Then, the main conductive path of the transistor M1 and the main conductive path of the transistor M2 are connected in parallel between the external terminal T2 and the external terminal T3.

When the signal DI1 is input to the pull-up circuit PU1, a signal DI2 that is an inverted signal of the signal DI1 is input to the gate of the transistor M1. When a level of the signal DI2 becomes higher than a threshold value voltage Vt_M1 between gate and source of the transistor M1, the transistor M1 is turned on. In addition, the signal DI1 is input also to the gate of the transistor M2. When a level of the signal DI1 is decreased so that a gate-source voltage of the transistor M2 becomes lower than a threshold value voltage Vt_M2 of the transistor M2, the transistor M2 is also turned on. The transistor M2 functions as a switch of the pull-up circuit PU1, and the resistor R1 functions as slew rate adjusting means.

Turn-on timings of the transistors M1 and M2 are substantially the same in a macroscopic view. However, noticing a change in the potential at the external terminal T3 after the transistors M1 and M2 are turned on, the change is caused by depths of turn-on states of the transistors M1 and M2. In other words, the potential at the external terminal T3 depends on turn-on timing of the transistor M1 that is not affected by the resistor R1. Therefore, the potential at the external terminal T3 increases rapidly to a voltage lower than the power supply voltage VDDDRV of the driver circuit DRV1 by the threshold value voltage Vt_M1 of the transistor M1. In other words, the transistor M1 makes a first response to the signal DI1 (DI2) at a first slew rate. After that, it appears that current does not flow in the main conductive path of the transistor M1, and hence current flows in the main conductive path of the transistor M2. Then, the power supply voltage VDDDRV of the driver circuit DRV1 supplied to the external terminal T2 is input through the transistor M2 and the resistor R1, and consequently the potential at the external terminal T3 increases to a potential close to the power supply voltage VDDDRV. A gradient of the increase in this case is inversely proportional to a resistance of the resistor R1 and is a little mild.

The pull-down circuit PD1 includes, for example, NMOS type transistors M3 to M5, and a resistor R2. Therefore, transistors of the same conductivity type are used. It is preferred that the transistors M3 to M5 be of a MOS type in view of power saving, but they may be replaced by bipolar transistors of an NPN type. A signal DI3 is input to control electrodes (gates) of the transistors M4 and M5. A first main electrode (drain) of the transistor M5 is connected to one terminal of the resistor R2, and a second main electrode (source) thereof is connected to the external terminal T4. The other terminal of the resistor R2 is connected to the external terminal T3. A first main electrode (drain) of the transistor M4 is connected to a second main electrode (source) of the transistor M3, while a second main electrode (source) thereof is commonly connected with a second main electrode of the transistor M5 and is connected to the external terminal T4. The transistor M3 is diode-connected. A first main electrode (drain) and a control electrode (gate) of the transistor M3 are commonly connected with the other terminal of the resistor R2 and is connected to the external terminal T3. The external terminal T4 is fixed to the reference potential VSSDRV of the driver circuit DRV1. Note that the transistor M3 may not be a transistor but may be replaced by a diode. In this case, the anode of the diode is connected to the external terminal T3, and the cathode thereof is connected to the first main electrode (drain) of the transistor M4. The reference potential VSSDRV of the driver circuit DRV1 is a ground potential GND, for example, but it may be set to a potential lower than the potential at the external terminal T3.

The resistor R2 has a function to make a resistance component value of the main conductive path of the transistor M5 be larger than that of the transistor M4. As another method without using the resistor R2, there is a method of decreasing a ratio W/L between a channel width W and a channel length L of the transistor M5. The resistance component value of the main conductive path becomes larger as the ratio W/L is made smaller, while it becomes smaller as the ratio W/L is made larger. Note that the resistor R2 can be considered as a part of the main conductive path of the transistor M5. Then, the main conductive path of the transistor M5 and the main conductive path of the transistor M4 are connected in parallel between the external terminal T3 and the external terminal T4.

When the signal DI3 is input to the pull-down circuit PD1 and a level of the signal DI3 becomes higher than a threshold value voltage between gate and source of the transistors M4 and M5, each of the transistors M4 and M5 is turned on. The transistor M5 functions as a switch of the pull-down circuit PD1, and the resistor R2 functions as slew rate adjusting means.

Ignoring a voltage between drain and source of the transistor M4, the potential at the external terminal T3 is substantially the same as a threshold value voltage Vt_M3 between gate and source of the transistor M3. In other words, the transistor M4 makes a first response to the signal DI3 at a first slew rate. After that, it appears that current does not flow in the main conductive path of the transistor M4, and hence current flows in the main conductive path of the transistor M5. Then, the potential at the external terminal T3 decreases to the potential at the external terminal T4. A gradient of the decrease in this case is inversely proportional to a resistance of the resistor R2 and is a little mild. In other words, the transistor M5 makes a second response to the signal DI3 at a second slew rate having a milder gradient than the first slew rate. By setting time necessary for the second response to be longer than that for the first response, occurrence of ringing can be prevented. Note that if the transistor M3 is replaced by a diode, a forward voltage of the diode is referred to as a threshold value voltage.

The signals DI1 to DI3 input to the pull-up circuit PU1 and the pull-down circuit PD1, and a signal HG1 output from the external terminal T3 are briefly described below. The signal DI1 rises at time t1 and falls at time t6, for example. The signal DI2 is an inverted signal of the signal DI1, and therefore it rises at time t1 and falls at time t6, for example. The signal DI3 rises at time t2 later than time t1 and falls at time t5 earlier than time t6. The interval from time t1 to time t2 and the interval from time t5 to time t6 are set as dead time intervals. When these signals are input to the pull-up circuit PU1 and the pull-down circuit PD1, the signal HG1 is output from the external terminal T3.

The signal HG1 starts to decrease at time t2 when the signal DI3 rises, and it rapidly decreases until time t3 when reaching a threshold value voltage Vt_M3 of the transistor M3. In the interval from time t3 to time t4, due to an effect of the resistor R2, the signal HG1 gradually decreases to the reference potential VSSDRV of the driver circuit DRV1. Therefore, behavior of the driver circuit DRV1 in the interval from time t1 to time t4 is determined by the pull-down circuit PD1.

The signal HG1 starts to increase at time t6 when the signal DI1 falls while the signal DI2 rises, and it rapidly increases until time t7 when reaching a voltage lower than the power supply voltage VDDDRV of the driver circuit DRV1 by the threshold value voltage Vt_M1 of the transistor M1. In the interval from time t7 to time t8, due to an effect of the resistor R1, the signal HG1 gradually increases to the power supply voltage VDDDRV of the driver circuit DRV1. Therefore, behavior of the driver circuit DRV1 from time t5 to time t8 is determined by the pull-up circuit PU1.

The feature of the driver circuit DRV1 is summarized as follows. The pull-up circuit PU1 constituted of the transistors M1 and M2 and the resistor R1 responds to a falling edge of the input signal in two steps, i.e. it makes the first response by the transistor M1 and the second response by the transistor M2. The timing when the first response and the second response are switched is when a voltage difference between the external terminal T2 and the external terminal T3 reaches the threshold value voltage Vt_M1 of the transistor M1. The time necessary for the second response, which is set by the transistor M2 and the resistor R1, is set longer than the time necessary for the first response. In addition, the pull-down circuit PD1 also responses in two steps including the first response and the second response. Further, the timing when the first response and the second response are switched is when a voltage difference between the external terminal T3 and the external terminal T4 reaches the threshold value voltage Vt_M3 of the transistor M3.

The feature of the driver circuit DRV1 is summarized in another point of view as follows. The driver circuit DRV1 includes the pull-up circuit PU1 and the pull-down circuit PD1, which share the external terminal T3 and output the signal HG1 from the external terminal T3 in accordance with on-off operation of the complementary signals DI1 and DI2 and the signal DI3. The "complementary signals" mean signals that turn on one of the pull-up circuit PU1 and the pull-down circuit PD1 while turn off the other, except for the dead time intervals. In addition, the "on-off operation" means operation to turn on or off the pull-up circuit PU1 and the pull-down circuit PD1 using the "complementary signals". The pull-up circuit PU1 and the pull-down circuit PD1 are connected in series between the external terminal T2 and the external terminal T4 via the external terminal T3. At least one of the pull-up circuit PU1 and the pull-down circuit PD1 responses to each of rising edges and falling edges of the signals DI1 (DI2) and DI3, as the first response in the interval from time t2 to time t3 (or in the interval from time t6 to time t7) and the second response in the interval from time t3 to time t4 (or in the interval from time t7 to time t8).

<Second Embodiment of Driver Circuit>

Figure 2:
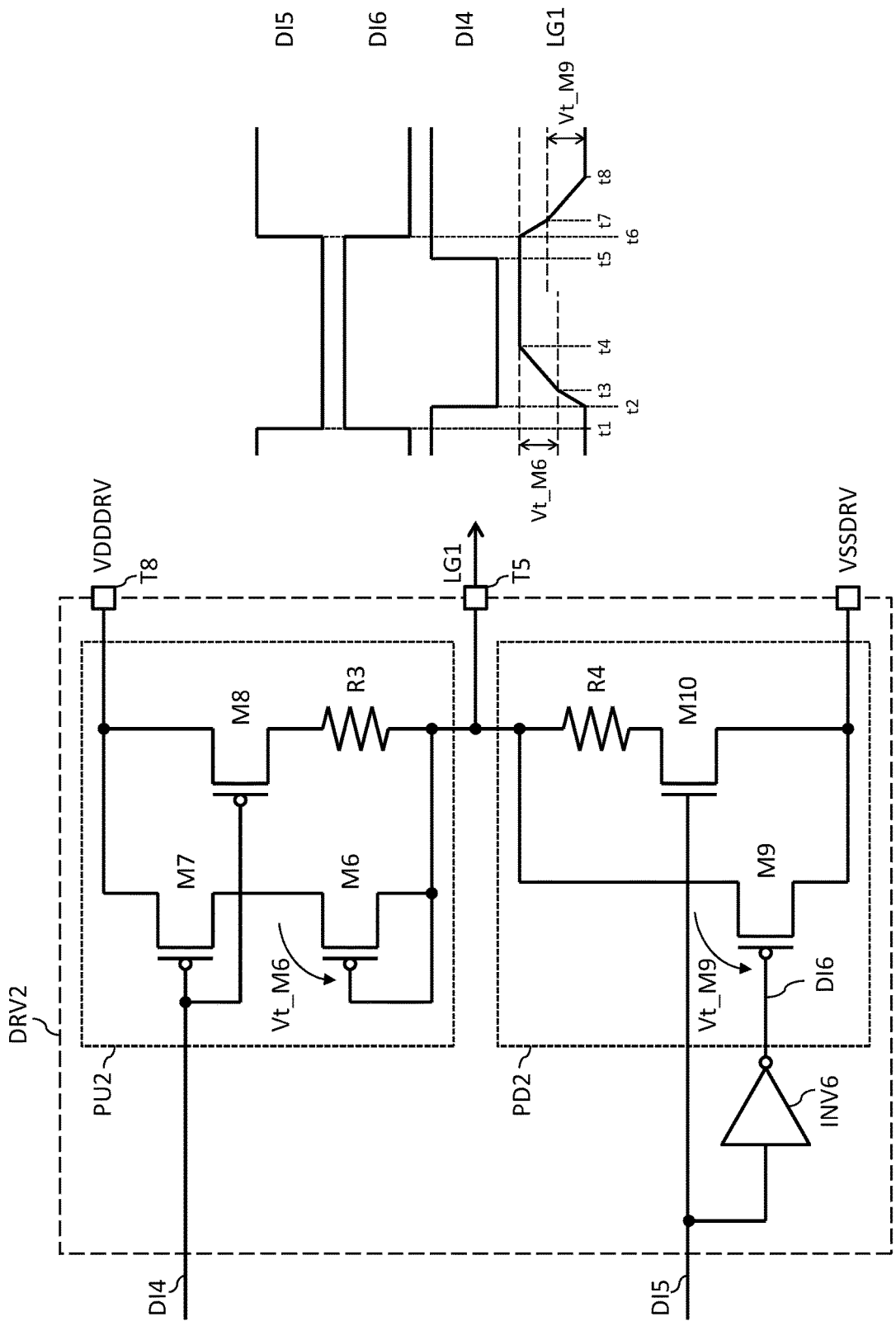
FIG. 2 is a circuit diagram of a second embodiment of the driver circuit according to the present invention.

FIG. 2 illustrates a second embodiment of the driver circuit according to the present invention. A driver circuit DRV2 includes a pull-up circuit PU2 and a pull-down circuit PD2. The pull-up circuit PU2 and the pull-down circuit PD2 share an external terminal T5 (output node) and are connected between an external terminal T8 applied with a power supply voltage VDDDRV of the driver circuit DRV2 and a reference potential VSSDRV of the driver circuit DRV2. The pull-up circuit PU2 pulls up a potential at the external terminal T5 to the power supply voltage VDDDRV of the driver circuit DRV2. In addition, the pull-down circuit PD2 pulls down a potential at the external terminal T5 to the reference potential VSSDRV of the driver circuit DRV2.

The pull-up circuit PU2 and the pull-down circuit PD2 share the output node (external terminal T5) and are connected in series between the external terminal T8 (power supply voltage VDDDRV of the driver circuit DRV2) and the reference potential VSSDRV of the driver circuit DRV2.

The pull-up circuit PU2 includes, for example, PMOS type transistors M6 to M8, and a resistor R3. Therefore, transistors of the same conductivity type are used. It is preferred that the transistors M6 to M8 be of a MOS type in view of power saving, but they may be replaced by bipolar transistors of a PNP type. An input signal DI4 is input to control electrodes (gates) of the transistors M7 and M8. A first main electrode (source) of the transistor M7 is connected to the external terminal T8, and the second main electrode (drain) thereof is connected to a first main electrode (source) of the transistor M6. The transistor M6 is diode-connected, i.e. a second main electrode (drain) and a control electrode (gate) thereof are commonly connected and are connected to the external terminal T5. A first main electrode (source) of the transistor M8 is commonly connected with the first main electrode of the transistor M7 and is connected to the external terminal T8, while a second main electrode (drain) thereof is connected to one terminal of the resistor R3. The other terminal of the resistor R3 is connected to the external terminal T5. The transistors M7 and M8 are turned on at substantially the same time. Ignoring a voltage between source and drain of the transistor M7, the potential at the external terminal T5 is substantially the same as a threshold value voltage Vt_M6 of the transistor M6. After that, it appears that current does not flow in the main conductive path of the transistor M7, and hence current flows in the main conductive path of the transistor M8. Then, the potential at the external terminal T5 increases to the power supply voltage VDDDRV of the driver circuit DRV2. Therefore, the transistor M8 functions as a switch of the pull-up circuit PU2, and the resistor R3 functions as slew rate adjusting means.

The pull-down circuit PD2 includes, for example, an NMOS type transistor M10, a PMOS type transistor M9, and a resistor R4. Therefore, transistors of opposite conductivity types are used. It is preferred that the transistors M9 and M10 be of a MOS type in view of power saving. However, the transistor M9 may be replaced by a PNP type bipolar transistor, and the transistor M10 may be replaced by an NPN type bipolar transistor. An input signal DI5 is input to a control electrode (gate) of the transistor M10 and an input side of an inverter INV6. A first main electrode (drain) of the transistor M10 is connected to one terminal of the resistor R4, and a second main electrode (source) thereof is connected to the reference potential VSSDRV of the driver circuit DRV2. The other terminal of the resistor R4 is connected to the external terminal T5. An output side of the inverter INV6 is connected to a control electrode (gate) of the transistor M9. A first main electrode (source) of the transistor M9 is commonly connected with the other terminal of the resistor R4 and is connected to the external terminal T5, while a second main electrode (drain) thereof is commonly connected with a second main electrode of the transistor M10 and is connected to the reference potential VSSDRV of the driver circuit DRV2.

When a level of the signal DI5 becomes higher than the threshold value voltage between gate and source of the transistor M10, the transistor M10 is turned on. In addition, when a level of a signal DI6 that is an inverted signal of the signal DI5 by the inverter INV6 becomes lower than a threshold value voltage Vt_M9 between gate and source of the transistor M9, the transistor M9 is turned on.

The signals DI4 to DI6 input to the pull-up circuit PU2 and the pull-down circuit PD2, and a signal LG1 output from the external terminal T5 are briefly described below. The signal DI5 falls at time t1 and rises at time t6, for example. The signal DI6 is an inverted signal of the signal DI5, and hence it rises at time t1 and falls at time t6, for example. The signal DI4 falls at time t2 later than time t1 and rises at time t5 earlier than time t6. The interval from time t1 to time t2 and the interval from time t5 to time t6 are set as dead time intervals. When these signals are input to the pull-up circuit PU2 and the pull-down circuit PD2, the signal LG1 is output from the external terminal T5.

The signal LG1 starts to increase at time t2 when the signal DI4 falls, and it rapidly increases until time t3 when reaching a voltage lower than the power supply voltage VDDDRV of the driver circuit DRV2 by the threshold value voltage Vt_M6 of the transistor M6. In the interval from time t3 to time t4, due to an effect of the resistor R3, the signal LG1 gradually increases to the power supply voltage VDDDRV of the driver circuit DRV2. Therefore, behavior of the driver circuit DRV2 in the interval from time t1 to time t4 is determined by the pull-up circuit PU2.

The signal LG1 starts to decrease at time t6 when the signal DI5 rises while the signal DI6 falls, and it rapidly decreases until time t7 when reaching the threshold value voltage Vt_M9 of the transistor M9. In the interval from time t7 to time t8, due to an effect of the resistor R4, the signal LG1 gradually decreases to the ground potential GND. Therefore, behavior of the driver circuit DRV2 from time t5 to time t8 is determined by the pull-down circuit PD2.

As obvious from the above description, similarly to FIG. 1, FIG. 2 illustrates the driver circuit in which the pull-up circuit PU2 and the pull-down circuit PD2 response in two steps including the first response and the second response in accordance with the input signals (signals DI4 to DI6). In addition, it may possible that one of the pull-up circuit PU2 and the pull-down circuit PD2 responses as the first response or the second response. In other words, for example, only the pull-up circuit PU2 responses in two steps including the first response and the second response.

In summary, the feature of the drive circuit DRV2 of FIG. 2 is substantially the same as that of FIG. 1. In other words, the first response and the second response are consecutively performed in order, and the level at which the two responses are switched is uniquely determined by the threshold value voltage of the MOS transistor or the forward voltage between base and emitter of the bipolar transistor.

It is one of design matters whether to adopt the driver circuit DRV1 of FIG. 1 or the driver circuit DRV2 of FIG. 2 as the driver circuit, and it should be appropriately determined in accordance with a circuit structure of a pre-stage or post-stage of the driver circuit. For instance, it should be appropriately determined in accordance with a polarity of the input signal input to the driver circuit or a circuit structure of the switching regulator connected to the post-stage of the driver circuit.

Common points between the driver circuit of FIG. 1 and the driver circuit of FIG. 2 are summarized as follows. Each of the driver circuits DRV1 and DRV2 includes the pull-up circuit (PU1 or PU2) and the pull-down circuit (PD1 or PD2) that share the external terminal T3 or T5 (output node) and output the signal HG1 or LG1 from the output node by on-off operation of the complementary input signals. Further, the pull-up circuit and the pull-down circuit are connected in series between the power supply voltage VDDDRV of the driver circuit and the reference potential VSSDRV of the driver circuit via the output node. Further, at least one of the pull-up circuit and the pull-down circuit responses each of the rising edge and the falling edge of the input signal in two steps including the first response and the second response.

The driver circuits of FIGS. 1 and 2 can be applied to a circuit for reducing noise, ringing, or the like generated in the output signal in general, various interface circuits, a general waveform shaping circuit, a data buffer circuit used for a memory, a microprocessor, or the like, an output impedance adjusting circuit, and various types of switching regulators.

<First Embodiment of Switching Regulator>

Figure 3:
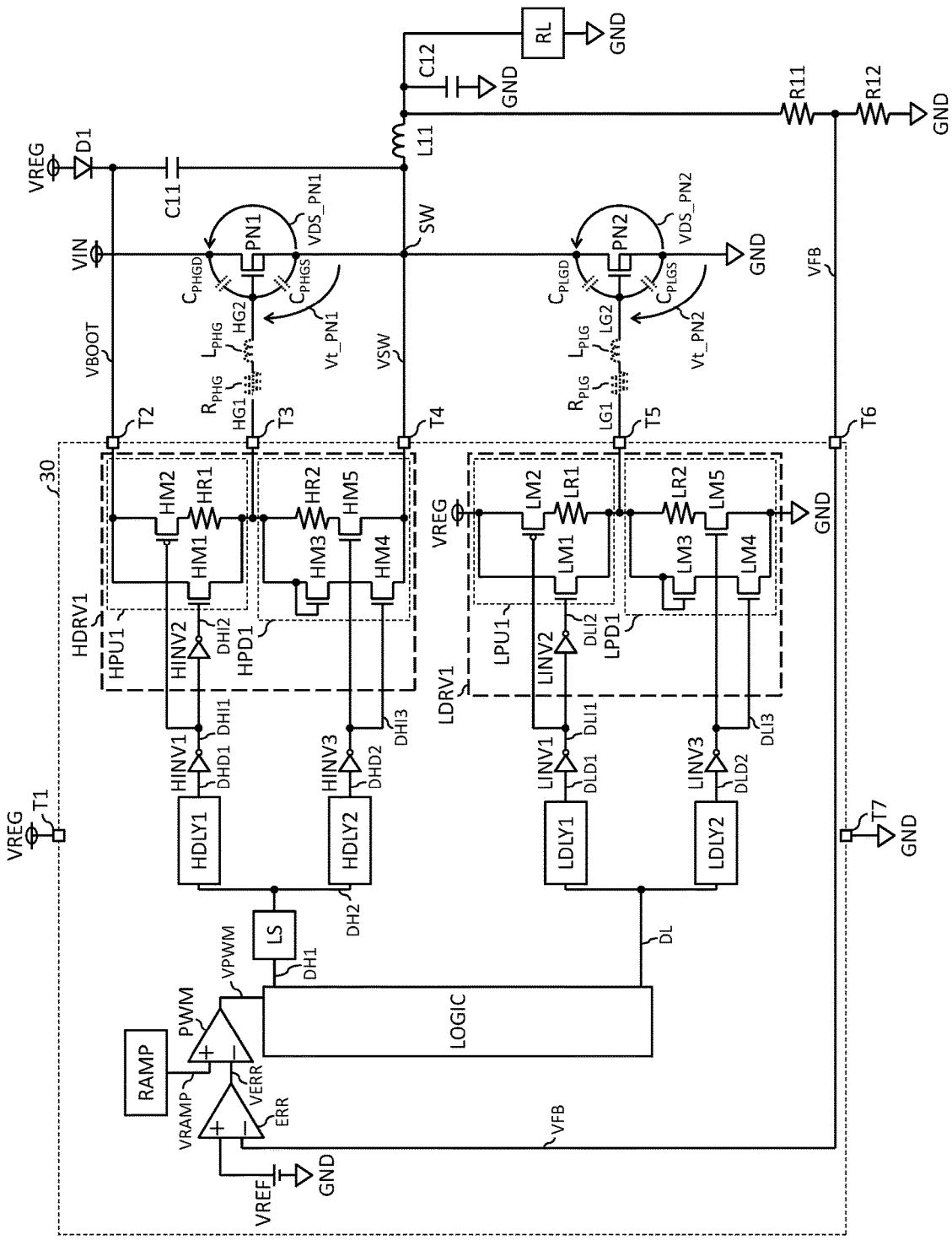
FIG. 3 is a circuit diagram of a first embodiment of a switching regulator using the driver circuit according to the present invention.

FIG. 3 is a circuit diagram of a first embodiment of the switching regulator using the driver circuit DRV1 of FIG. 1, which is a step-down type DC/DC converter with a bootstrap circuit. A switching regulator 300 of FIG. 3 includes a semiconductor device 30, a high-side transistor PN1, a low-side transistor PN2, a bootstrap capacitor C11, a bootstrap diode D1, an inductor L11, a capacitor C12, and a load RL. The inductor L11 stores electromagnetic energy when the high-side transistor PN1 is turned on via a driver circuit HDRV1 of the semiconductor device 30 and the external terminal T3 so that current is supplied. The capacitor C12 smooths the stored electromagnetic energy. Further, the semiconductor device 30 has at least external terminals T1 to T7. The external terminal T1 is a power supply terminal applied with a power supply voltage VREG of the semiconductor device 30. The external terminal T2 is a bootstrap voltage input terminal. The external terminal T3 is a high-side drive terminal. The external terminal T4 is an inductor connection terminal of the switching regulator 300. The external terminal T5 is a low-side drive terminal. The external terminal T6 is a feedback terminal. The external terminal T7 is a ground terminal fixed to the ground potential GND.

The semiconductor device 30 includes the driver circuit HDRV1 using the driver circuit DRV1 illustrated in FIG. 1 as a high-side driver, and a driver circuit LDRV1 using the same as a low-side driver. The driver circuit HDRV1 (high-side driver circuit) includes a pull-up circuit HPU1 and a pull-down circuit HPD1. The driver circuit LDRV1 (low-side driver circuit) includes a pull-up circuit LPU1 and a pull-down circuit LPD1.

The driver circuit HDRV1 drives the high-side transistor PN1 via the external terminal T3. The driver circuit LDRV1 drives the low-side transistor PN2 via the external terminal T5.

Specific circuit operations of the driver circuits HDRV1 and LDRV1 are described above with reference to FIG. 1, and overlapping description is omitted.

Each of the high-side transistor PN1 and the low-side transistor PN2 includes a first main electrode (drain), a second main electrode (source), and a control electrode (gate). If the high-side transistor PN1 and the low-side transistor PN2 are bipolar transistors, the first main electrode, the second main electrode, and the control electrode correspond to collector, emitter, and base, respectively.

The high-side transistor PN1 and the low-side transistor PN2 are on/off controlled by the high-side gate signal HG1 and the low-side gate signal LG1 input from the semiconductor device 30, respectively. The drain of the high-side transistor PN1 is connected to an input voltage VIN of the switching regulator 300, and the source thereof is connected to a switching node SW. The drain of the low-side transistor PN2 is connected to the switching node SW, and the source thereof is connected to the ground potential GND. There is a parasitic capacitance CPHGD between gate and drain of the high-side transistor PN1, and there is a parasitic capacitance CPHGS between gate and source thereof. There is a parasitic capacitance CPLGD between gate and drain of the low-side transistor PN2, and there is a parasitic capacitance CPLGS between gate and source thereof. Such a parasitic capacitance forms an undesired resonance circuit together with a parasitic inductance described later, which causes occurrence of ringing or abnormal oscillation. The present invention provides a driver circuit and a switching regulator that can solve this problem.

The switching node SW is connected to one terminal of a coil L11. The other terminal of the coil L11 is connected to one terminal of a resistor R11, one terminal of the capacitor C12, and one terminal of the load RL. The other terminal of the resistor R11 is connected to one terminal of a resistor R12. The other terminal of the resistor R12 is connected to the ground potential GND. A feedback voltage VFB is generated at a connection node between the resistors R11 and R12. The feedback voltage VFB is fed back to an error amplifier ERR of the semiconductor device 30 via the external terminal T6.

A parasitic resistance RPHG and a parasitic inductance LPHG are connected in series between the external terminal T3 and the gate of the high-side transistor PN1. Such parasitic components depend on a wiring length from the external terminal T3 to the gate of the high-side transistor PN1 and a physical size of the high-side transistor PN1. The parasitic resistance RPHG and the parasitic inductance LPHG are the smallest when the high-side transistor PN1 is formed inside the semiconductor device 30. On the contrary, although also depending on a wiring material, these parasitic components cannot be ignored when the wiring length from the external terminal T3 to the high-side transistor PN1 is long. In particular, when the high-side transistor PN1 is constituted as a discrete component, these parasitic components affect largely. Such parasitic components cause an undesired signal together with the parasitic capacitance described above. In the present invention, the driver circuit HDRV1 outputs the drive signal HG1 without influence of the parasitic components.

A parasitic resistance RPLG and a parasitic inductance LPLG are connected in series between the external terminal T5 and the gate of the low-side transistor PN2. Such parasitic components depend on a wiring length from the external terminal T5 to the gate of the low-side transistor PN2 and a physical size of the low-side transistor PN2. The parasitic resistance RPLG and the parasitic inductance LPLG are the smallest when the low-side transistor PN2 is formed inside the semiconductor device 30. On the contrary, although also depending on a wiring material, these parasitic components cannot be ignored when the wiring length from the external terminal T5 to the low-side transistor PN2 is long. In particular, when the low-side transistor PN2 is constituted as a discrete component, these parasitic components affect largely. In any case, in the present invention, the driver circuit LDRV1 outputs the drive signal LG1 without influence of the parasitic components.

The parasitic components existing on gate sides of the high-side transistor PN1 and the low-side transistor PN2 become factors that cause undesired ringing. However, as described above with reference to FIGS. 1 and 2, the present invention can prevent occurrence of such ringing because at least one of the rising edge and the falling edge of the high-side gate signal HG1 and the low-side gate signal LG1 has at least two gradients having different slew rates.

The semiconductor device 30 includes, in addition to the driver circuits HDRV1 and LDRV1, the error amplifier circuit ERR, a ramp circuit RAMP, a pulse width modulation comparator PWM, a logic circuit LOGIC, and a level shift circuit LS. Further, it includes a delay circuits HDLY1, HDLY2, LDLY1 and LDLY2, and inverters HINV1, HINV3, LINV1 and LINV3.

The feedback voltage VFB is input to an inverting input terminal (−) of the error amplifier ERR, and a reference voltage VREF is input to a non-inverting input terminal (+) thereof. The error amplifier ERR amplifies a difference between the input voltages so as to output an error voltage VERR. The error voltage VERR is input to an inverting input terminal (−) of the pulse width modulation comparator PWM.

The pulse width modulation comparator PWM compares a ramp voltage VRAMP output from the ramp circuit RAMP with the error voltage VERR output from the error amplifier circuit ERR, so as to output a pulse width modulation signal VPWM according to the error voltage VERR, and the pulse width modulation signal VPWM is input to the logic circuit LOGIC.

The logic circuit LOGIC includes an oscillator, an RS flip-flop, and the like, for generating a signal used for driving the DC/DC converter, for example. The logic circuit LOGIC outputs signals DH1 and DL. The signal DH1 becomes a signal source (initial signal) to drive the driver circuit HDRV1, and the signal DL becomes a signal source to drive the driver circuit LDRV1.

The level shift circuit LS generates a signal DH2 by level shifting the signal DH1. The signal DH2 is a signal that is level shifted to a potential between a bootstrap voltage VBOOT and the switching node SW, for driving the driver circuit HDRV1.

The signal DH2 becomes an initial signal to drive the driver circuit HDRV1 and is input to the delay circuits HDLY1 and HDLY2. The delay circuit HDLY1 detects, for example, a rising timing of the signal DH2 so as to generate a delay signal DHD1. As a result, a falling timing of the delay signal DHD1 is substantially the same as a falling timing of the signal DH2, but a rising timing of the delay signal DHD1 is delayed from the rising timing of the signal DH2.

Unlike the delay circuit HDLY1, the delay circuit HDLY2 detects, for example, a falling timing of the signal DH2 so as to generate a delay signal DHD2. As a result, a rising timing of the delay signal DHD2 is substantially the same as the rising timing of the signal DH2, but a falling timing of the delay signal DHD2 is delayed from the falling timing of the signal DH2.

As described above, the delay circuit HDLY1 detects the rising timing of the signal DH2 so as to generate the delay signal DHD1, and the delay circuit HDLY2 detects a falling timing of the signal DH2 so as to generate the delay signal DHD2. This is for the purpose of setting dead time in switching operations of the pull-up circuit HPU1 and the pull-down circuit HPD1 in the post stage, so as to prevent through current that can flow from the external terminal T2 (bootstrap voltage input terminal) to the external terminal T4 (output terminal of the switching regulator 300) via the pull-up circuit HPU1 and the pull-down circuit HPD1.

The signal DL becomes an initial signal to drive the driver circuit LDRV1 and is input to the delay circuits LDLY1 and LDLY2. The delay circuit LDLY1 detects, for example, a rising timing of the signal DL so as to generate a delay signal DLD1. Unlike the delay circuit LDLY1, the delay circuit LDLY2 detects, for example, a falling timing of the signal DL so as to generate a delay signal DLD2. The signal DLD1 is input to the inverter LINV1, and the delay signal DLD2 is input to the inverter LINV3. An output signal DLI1 of the inverter LINV1 and an output signal DLI3 of the inverter LINV3 are input to the driver circuit LDRV1 as input signals.

The delay circuits LDLY1 and LDLY2 are provided for setting dead time in switching operations of the pull-up circuit LPU1 and the pull-down circuit LPD1.

Figure 4:
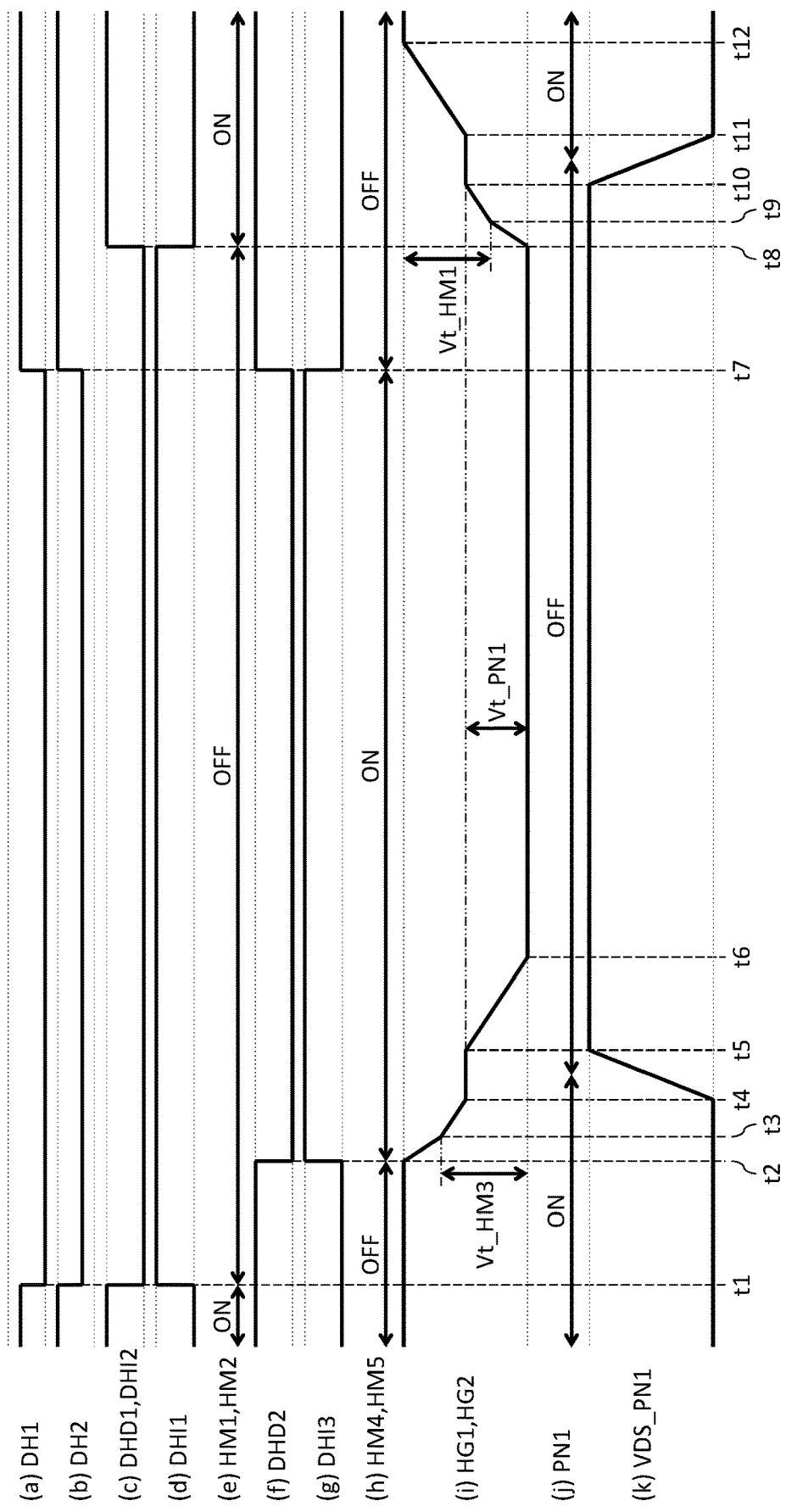
FIG. 4 is a timing chart of a high-side driver circuit in the switching regulator of FIG. 3.

FIG. 4 is a timing chart of the driver circuit HDRV1 in the switching regulator 300 of FIG. 3.

(a) DH1 is the initial signal to drive the driver circuit HDRV1 and is output from the logic circuit LOGIC. The signal DH1 falls at time t1 and rises at time t7, for example.

(b) DH2 is an output signal of the level shift circuit LS. The signal DH2 falls at time t1 and rises at time t7, for example. The signal DH2 has the same logic as the signal DH1 and is obtained by voltage conversion of a potential of the signal DH1 into a potential between the bootstrap voltage VBOOT and the switching node SW.

(c) DHD1 is an output signal of the delay circuit HDLY1 and is obtained by delaying the signal DH2 by the delay circuit HDLY1. The delay circuit HDLY1 delays only rising edges of the signal DH2, for example. Therefore, the signal DHD1 falls at time t1 and rises at time t8, for example. In addition, (c) DHI2 is an output signal of an inverter HINV2 and is obtained by inverting the signal DHI1 by the inverter HINV2. The signal DHI2 is substantially the same as the signal DHD1 as a result.

(d) DHI1 is an output signal of the inverter HINV1 and is obtained by inverting the signal DHD1 by the inverter HINV1. Unlike the signal DHD1, the signal DHI1 rises at time t1 and falls at time t8, for example.

(e) HM1 and HM2 show on/off states of transistors HM1 and HM2. An on/off state of the transistor HM1 depends on a high or low level of the signal DHI2. The transistor HM1 is turned on when the signal DHI2 is at high level, and it is turned off when the signal DHI2 is at low level. An on/off state of the transistor HM2 depends on a low or high level of the signal DHI1. The transistor HM2 is turned on when the signal DHI1 is at low level, and it is turned off when the signal DHI1 is at high level. Therefore, the transistors HM1 and HM2 are turned on in the same interval and are turned off in other intervals. The transistors HM1 and HM2 are turned off in the interval from time t1 to time t8 and are turned on in other intervals, for example.

(f) DHD2 is an output signal of the delay circuit HDLY2 and is obtained by delaying the signal DH2 by the delay circuit HDLY2. The delay circuit HDLY2 delays only falling edges of the signal DH2, for example. Therefore, the signal DHD2 falls at time t2 and rises at time t7, for example.

(g) DHI3 is an output signal of the inverter HINV3 and is obtained by inverting the signal DHD2 by the inverter HINV3. Therefore, unlike the signal DHD2, the signal DHI3 rises at time t2 and falls at time t7, for example.

(h) HM4 and HM5 show on/off states of transistors HM4 and HM5. Each of the on/off states of the transistors HM4 and HM5 depends on a high or low level of the signal DHI3. The transistors HM4 and HM5 are turned on when the signal DHI3 is at high level and are turned off when the signal DHI3 is at low level. Therefore, the transistors HM4 and HM5 are turned on in the interval from time t2 to time t7 and are turned off in other intervals, for example.

(i) HG1 is a high-side gate signal output from the external terminal T3 of the driver circuit HDRV1. The high-side gate signal HG1 is maintained at high level (=VBOOT) until time t2 when the pull-down circuit HPD1 is turned on, i.e., when the transistors HM4 and HM5 are turned on. The high-side gate signal HG1 starts to decrease at the first slew rate (gradient) from time t2 and rapidly decreases until time t3 when reaching a threshold value voltage Vt_HM3 of the transistor HM3. After time t3, current hardly flows in the transistors HM3 and HM4, and current restricted by a resistor HR2 flows in the transistor HM5. Therefore, the high-side gate signal HG1 starts to decrease at the second slew rate having a milder gradient than the first slew rate from time t3, and it gradually decreases until time t4 when reaching a threshold value voltage Vt_PN1 of the transistor PN1. The high-side gate signal HG1 is maintained at a constant level in the interval from time t4 to time t5 in which the transistor PN1 is switched from on to off. The interval from time t4 to time t5 is uniquely determined on the basis of a resistance of the resistor HR2, i.e. a current value flowing in the transistor HM5, a gate-drain capacitance CPHGD of the transistor PN1, and a gate-source capacitance CPHGS of the same. The high-side gate signal HG1 starts to decrease again at the second slew rate from time t5 when the on/off transition of the transistor PN1 is completed, and it gradually decreases until time t6 when reaching a switching voltage VSW that is a reference potential of the driver circuit HDRV1. Therefore, behavior of the high-side gate signal HG1 is determined mainly by the transistors HM3 and HM4 in the interval from time t2 to time t3, and it is determined by the transistor HM5 in the interval from time t3 to time t6.

(i) The high-side gate signal HG1 reaches the switching voltage VSW that is a reference potential of the driver circuit HDRV1 at time t6 and is maintained at low level until time t8 when the pull-up circuit HPU1 is turned on, i.e. when the transistors HM1 and HM2 are turned on. The high-side gate signal HG1 starts to increase at the first slew rate (gradient) from time t8 and rapidly increases until time t9 when reaching a voltage lower than the power supply voltage VBOOT of the driver circuit HDRV1 by a threshold value voltage Vt_HM1 of the transistor HM1. After time t9, current hardly flows in the transistor HM1, and current restricted by a resistor HR1 flows in the transistor HM2. Therefore, the high-side gate signal HG1 starts to increase at the second slew rate having a milder gradient than the first slew rate from time t9, and it gradually increases until time t10 when reaching the threshold value voltage Vt_PN1 of the transistor PN1. The high-side gate signal HG1 is maintained at a constant level in the interval from time t10 to time t11 in which the transistor PN1 is switched from off to on. The interval from time t10 to time t11 is uniquely determined on the basis of a resistance of the resistor HR1, i.e. a current value flowing in the transistor HM2, the gate-drain capacitance CPHGD of the transistor PN1, and the gate-source capacitance CPHGS of the same. The high-side gate signal HG1 starts to increase again at the second slew rate from time t11 when the on/off transition of the transistor PN1 is completed, and it gradually increases until time t12 when the bootstrap voltage VBOOT that is the power supply voltage of the driver circuit HDRV1. Therefore, behavior of the high-side gate signal HG1 is determined mainly by the transistor HM1 in the interval from time t8 to time t9, and it is determined by the transistor HM2 in the interval from time t9 to time t12.

In addition, (i) HG2 is a high-side gate signal affected by the parasitic resistance RPHG and the parasitic inductance LPHG. In other words, the high-side gate signal HG2 is input to the gate of the high-side transistor PN1. The high-side gate signal HG2 is shown to have substantially the same signal waveform as the high-side gate signal HG1 although it is affected by the parasitic components of the resistor and the inductor. This indicates that such influence of the parasitic components can be suppressed by giving some gradients to falling edges and rising edges of the high-side gate signal HG1 output from the driver circuit HDRV1.

(j) PN1 shows an on/off state of the high-side transistor PN1. The on/off state of the high-side transistor PN1 depends on the high-side gate signal HG2, and it is turned on when the high-side gate signal HG2 is higher than the high-side threshold value voltage Vt_PN1 of the transistor PN1 and is turned off when the high-side gate signal HG2 is lower than the same. Therefore, for example, the high-side transistor PN1 is turned on in the interval before time t4, is switched from on to off in the interval from time t4 to time t5, and is turned off in the interval from time t5 to time t10. Further, it is switched from off to on in the interval from time t10 to time t11 and is turned on in the interval after time t11.

(k) VDS_PN1 is a drain-source voltage of the high-side transistor PN1. The drain-source voltage VDS_PN1 substantially depends on an on/off state of the high-side transistor PN1. Therefore, the drain-source voltage VDS_PN1 is at low level (the high-side transistor PN1 is turned on) in the interval before time t4, switches from low level to high level in the interval from time t4 to time t5, and is at high level (the high-side transistor PN1 is turned off) in the interval from time t5 to time t10. Further, it switches from high level to low level in the interval from time t10 to time t11 and is at low level in the interval after time t11.

Figure 5:
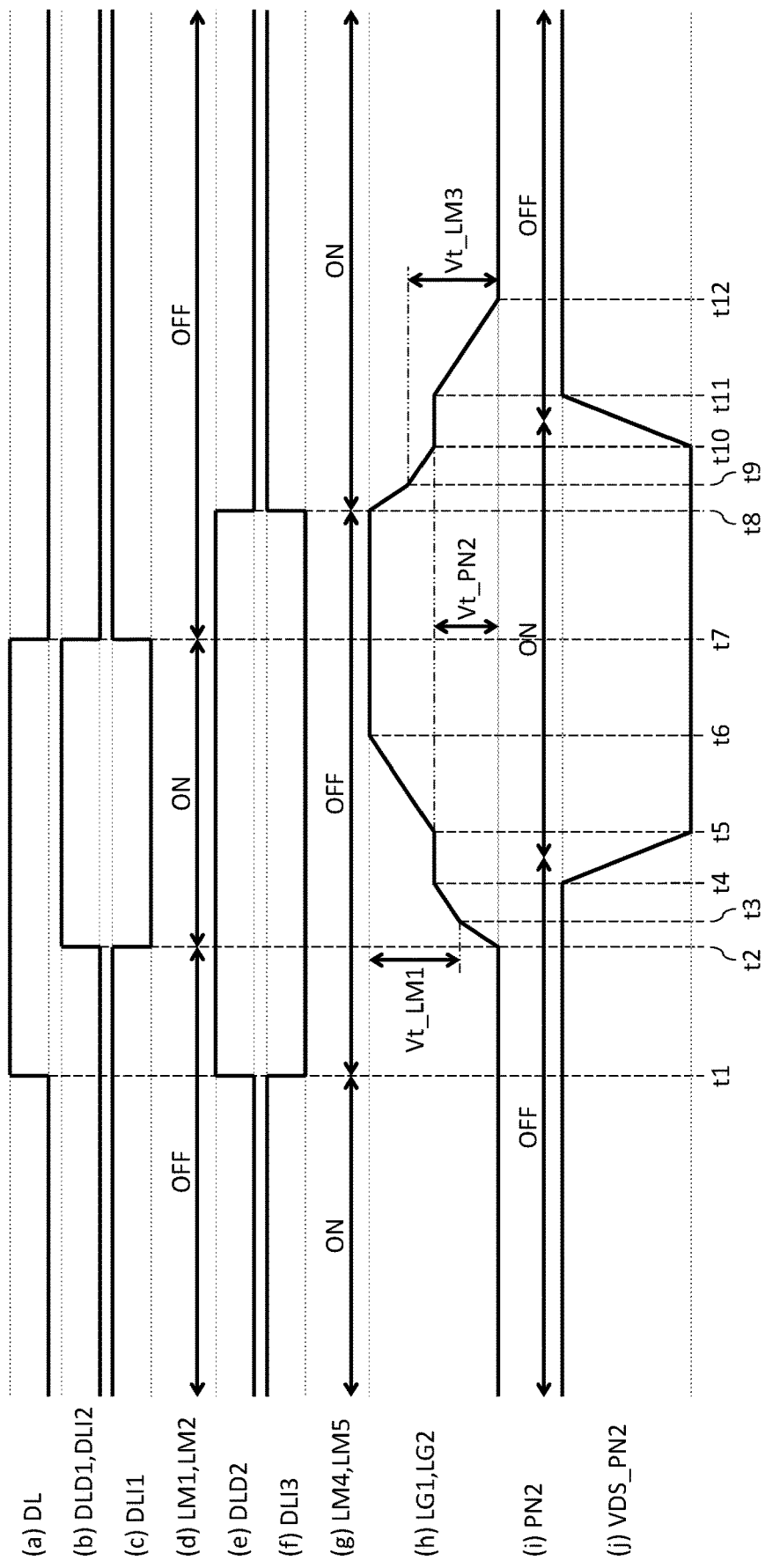
FIG. 5 is a timing chart of a low-side driver circuit in the switching regulator of FIG. 3.

FIG. 5 is a timing chart of the driver circuit LDRV1 in the switching regulator 300 of FIG. 3.

(a) DL is an initial signal to drive the low-side driver circuit LDRV1 and is output from the logic circuit LOGIC. The signal DL rises at time t1 and falls at time t7, for example. Note that the rising timing and the falling timing are merely design matters, and it may be possible to design so that the signal DL falls at time t1 and to rises at time t7.

(b) DLD1 is an output signal of the delay circuit LDLY1 and is obtained by delaying the signal DL by the delay circuit LDLY1. The delay circuit LDLY1 delays only rising edges of the signal DL, for example. Therefore, the signal DLD1 rises at time t2 and falls at time t7, for example. In addition, (b) DLI2 is an output signal of an inverter LINV2 and is obtained by inverting the signal DLI1 by the inverter LINV2. The signal DLI2 is substantially the same as the signal DLD1 as a result.

(c) DLI1 is an output signal of the inverter LINV1 and is obtained by inverting the signal DLD1 by the inverter LINV1. The signal DLI1 falls at time t2 and rises at time t7, for example.

(d) LM1 and LM2 show on/off states of transistors LM1 and LM2. An on/off state of the transistor LM1 depends on a high or low level of the signal DLI2, and it is turned on when the signal DLI2 is at high level and is turned off when the signal DLI2 is at low level. An on/off state of the transistor LM2 depends on low or high level of the signal DLI1, and it is turned on when the signal DLI1 is at low level and is turned off when the signal DLI1 is at high level. Therefore, the transistors LM1 and LM2 are turned on in the same interval and are turned off in other intervals. The transistors LM1 and LM2 are turned on in the interval from time t2 to time t7 and are turned off in other intervals, for example.

(e) DLD2 is an output signal of the delay circuit LDLY2 and is obtained by delaying the signal DL by the delay circuit LDLY2. The delay circuit LDLY2 delays only falling edges of the signal DL, for example. Therefore, the signal DLD2 rises at time t1 and falls at time t8, for example.

(f) DLI3 is an output signal of the inverter LINV3 and is obtained by inverting the signal DLD2 by the inverter LINV3. Therefore, the signal DLI3 falls at time t1 and rises at time t8, for example.

(g) LM4 and LM5 show on/off states of transistors LM4 and LM5. Each of the on/off states of the transistors LM4 and LM5 depends on a high or low level of the signal DLI3, and it is turned on when the signal DLI3 is at high level and is turned off when the signal DLI3 is at low level. Therefore, the transistors LM4 and LM5 are turned off in the interval from time t1 to time t8 and are turned on in other intervals, for example.

(h) LG1 is a low-side gate signal output from the external terminal T5 of the driver circuit LDRV1. The low-side gate signal LG1 is maintained at low level (=GND) until time t2 when the pull-up circuit LPU1 is turned on, i.e. when the transistors LM1 and LM2 are turned on. The low-side gate signal LG1 starts to increase at the first slew rate (gradient) from time t2 and rapidly increase until time t3 when reaching a voltage lower than the power supply voltage VREG of the driver circuit LDRV1 by a threshold value voltage Vt_LM1 of the transistor LM1. After time t3, current hardly flows in the transistor LM1, and current restricted by a resistor LR1 flows in the transistor LM2. Therefore, the low-side gate signal LG1 starts to increase at the second slew rate having a milder gradient than the first slew rate from time t3 and gradually increases until time t4 when reaching a threshold value voltage Vt_PN2 of the transistor PN2. The low-side gate signal LG1 is maintained at a constant level in the interval from time t4 to time t5 in which the transistor PN2 is switched from off to on. The interval from time t4 to time t5 is uniquely determined by a resistance of the resistor LR1, i.e. a current value flowing in the transistor LM2, a gate-drain capacitance CPLGD of the transistor PN2, and a gate-source capacitance CPLGS of the same. The low-side gate signal LG1 starts to increase again at the second slew rate from time t5 when the on/off transition of the transistor PN2 is completed and gradually increases until time t6 when reaching the power supply voltage VREG of the driver circuit LDRV1. Therefore, behavior of the low-side gate signal LG1 is determined mainly by the transistor LM1 in the interval from time t2 to time t3 and is determined by the transistor LM2 in the interval from time t3 to time t6.

(h) The low-side gate signal LG1 reaches the power supply voltage VREG of the driver circuit LDRV1 at time t6 and is maintained at high level until time t8 when the pull-down circuit LPD1 is turned on, i.e. when the transistors LM4 and LM5 are turned on. The low-side gate signal LG1 starts to decrease at the first slew rate (gradient) from time t8 and rapidly decreases until time t9 when reaching a threshold value voltage Vt_LM3 of the transistor LM3. After time t9, current hardly flows in the transistors LM3 and LM4, and current restricted by a resistor LR2 flows in the transistor LM5. Therefore, the low-side gate signal LG1 starts to decrease at the second slew rate having a milder gradient than the first slew rate from time t9 and gradually decreases until time t10 when reaching the threshold value voltage Vt_PN2 of the transistor PN2. The low-side gate signal LG1 is maintained at a constant level in the interval from time t10 to time t11 in which the transistor PN2 is switched from on to off. The interval from time t10 to time t11 is uniquely determined by a resistance of the resistor LR2, i.e. a current value flowing in the transistor LM5, the gate-drain capacitance CPLGD of the transistor PN2, and the gate-source capacitance CPLGS of the same. The low-side gate signal LG1 starts to decrease again at the second slew rate from time t11 when the on/off transition of the transistor PN2 is completed and gradually decreases until time t12 when reaching the ground potential GND that is a reference potential of the driver circuit LDRV1. Therefore, behavior of the low-side gate signal LG1 is determined mainly by the transistors LM3 and LM4 in the interval from time t8 to time t9 and is determined by the transistor LM5 in the interval from time t9 to time t12.

In addition, (h) LG2 is a low-side gate signal affected by the parasitic resistance RPLG and the parasitic inductance LPLG. In other words, the low-side gate signal LG2 is input to the gate of the low-side transistor PN2. The low-side gate signal LG2 is shown to have substantially the same signal waveform as the low-side gate signal LG1 although it is affected by the parasitic components of the resistor and the inductor. This indicates that such influence of the parasitic components can be suppressed by giving some gradients to falling edges and rising edges of the low-side gate signal LG1 output from the driver circuit LDRV1.

(i) PN2 shows an on/off state of the low-side transistor PN2. The on/off state of the low-side transistor PN2 depends on the low-side gate signal LG2, and it is turned on when the low-side gate signal LG2 is higher than the low-side threshold value voltage Vt_PN2 of the transistor PN2 and is turned off when the low-side gate signal LG2 is lower than the same. Therefore, for example, the low-side transistor PN2 is turned off in the interval before time t4, is switched from off to on in the interval from time t4 to time t5, and is turned on in the interval from time t5 to time t10. Further, it is switched from on to off in the interval from time t10 to time t11 and is turned off in the interval after the time t11.

(j) VDS_PN2 is a drain-source voltage of the low-side transistor PN2. The drain-source voltage VDS_PN2 substantially depends on an on/off state of the low-side transistor PN2. Therefore, the drain-source voltage VDS_PN2 is at high level (the low-side transistor PN2 is turned off) in the interval before time t4, switches from high level to low level in the interval from time t4 to time t5, and is at low level (the low-side transistor PN2 is turned on) in the interval from time t5 to time t10. Further, it switches from low level to high level in the interval from time t10 to time t11 and is at high level in the interval after time t11.

The signal waveforms at main nodes of the switching regulator 300 of FIG. 3 are described above with reference to the timing charts of FIGS. 4 and 5. Suppression of ringing generated in the switching regulator 300 can be achieved with a relatively simple circuit structure, by giving the first slew rate and the second slew rate having a milder gradient than the first slew rate to at least one of the falling edge and the rising edge of the gate signal output from the driver circuits HDRV1 and LDRV1 included in the semiconductor device 30, and by uniquely setting the level at which the two slew rates are switched using the threshold value voltage of the MOS transistor.

<Second Embodiment of Switching Regulator>

Figure 6:
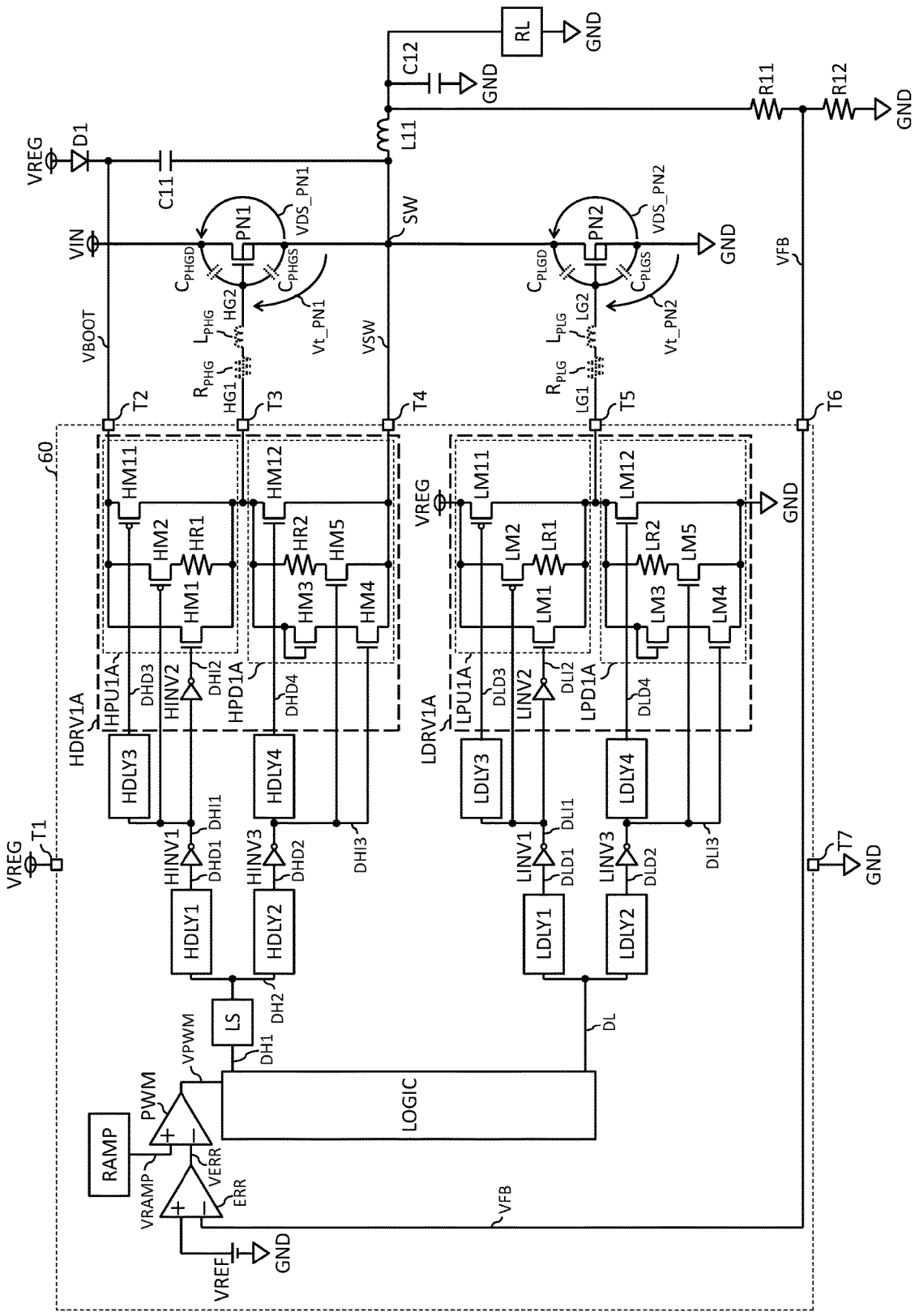
FIG. 6 is a circuit diagram of a second embodiment of the switching regulator using the driver circuit according to the present invention.

FIG. 6 is a circuit diagram of a second embodiment of the switching regulator using the driver circuit according to the present invention. A semiconductor device 60 in FIG. 6 is largely different from the semiconductor device 30 illustrated in FIG. 3 in the following two points. The first point is a circuit structure of the driver circuit. In FIG. 6, the driver circuit HDRV1 illustrated in FIG. 3 is replaced by a driver circuit HDRV1A, and the driver circuit LDRV1 is replaced by a drive circuit LDRV1A. Further, the driver circuit HDRV1A includes a pull-up circuit HPU1A and a pull-down circuit HPD1A, while the driver circuit LDRV1A includes a pull-up circuit LPU1A and a pull-down circuit LPD1A. These circuits are different from the circuits in FIG. 3 in that one transistor is added. For instance, the pull-up circuit HPU1A is provided with a transistor HM11 that is added to the pull-up circuit HPU1 in FIG. 3. In addition, the pull-down circuit HPD1A is provided with a transistor HM12 that is added to the pull-down circuit HPD1 in FIG. 3. The transistor HM11 has a function to increase a slew rate of the pull-up operation by the transistors HM1 and HM2 and the resistor HR1 at a predetermined timing. In addition, the transistor HM12 has a function to increase a slew rate of the pull-down operation by the transistors HM3 to HM5 and the resistor HR2 at a predetermined timing.

The second point of the difference between the semiconductor device 60 in FIG. 6 and the semiconductor device 30 in FIG. 3 is the number of stages in the delay circuit. For instance, the semiconductor device 60 in FIG. 6 includes a delay circuit HDLY3 between the gate side of the transistor HM11 in the pull-up circuit HPU1A and the output side of the inverter HINV1. The delay circuit HDLY3 delays only falling edges of the signal DHI1, for example. It has a function to turn on the transistor HM11 after the transistors HM1 and HM2 are turned on, using a delayed signal DHD3. The transistor HM11 has a function to set a third slew rate besides the function as a switch. This third slew rate has a gradient larger than that of the second slew rate of the transistor HM2. In order that the transistor HM11 has this function, the delay circuit HDLY3 is provided. In addition, a delay circuit HDLY4 is provided between the gate side of the transistor HM12 in the pull-down circuit HPD1A and the output side of the inverter HINV3. The delay circuit HDLY4 delays only rising edges of the signal DHI3, for example. It has a function to turn on the transistor HM12 after the transistors HM4 and HM5 are turned on, using a delayed signal DHD4. The transistor HM12 has a function to set the third slew rate besides the function as a switch. This third slew rate has a gradient larger than that of the second slew rate of the transistor HM5. In order that the transistor HM12 has this function, the delay circuit HDLY4 is provided.

The differences between FIG. 6 and FIG. 3 are described above. Note that the specific circuit structure of the driver circuit LDRV1A is substantially the same as the circuit structure of the driver circuit HDRV1A, and detailed description thereof is omitted.

Figure 7:
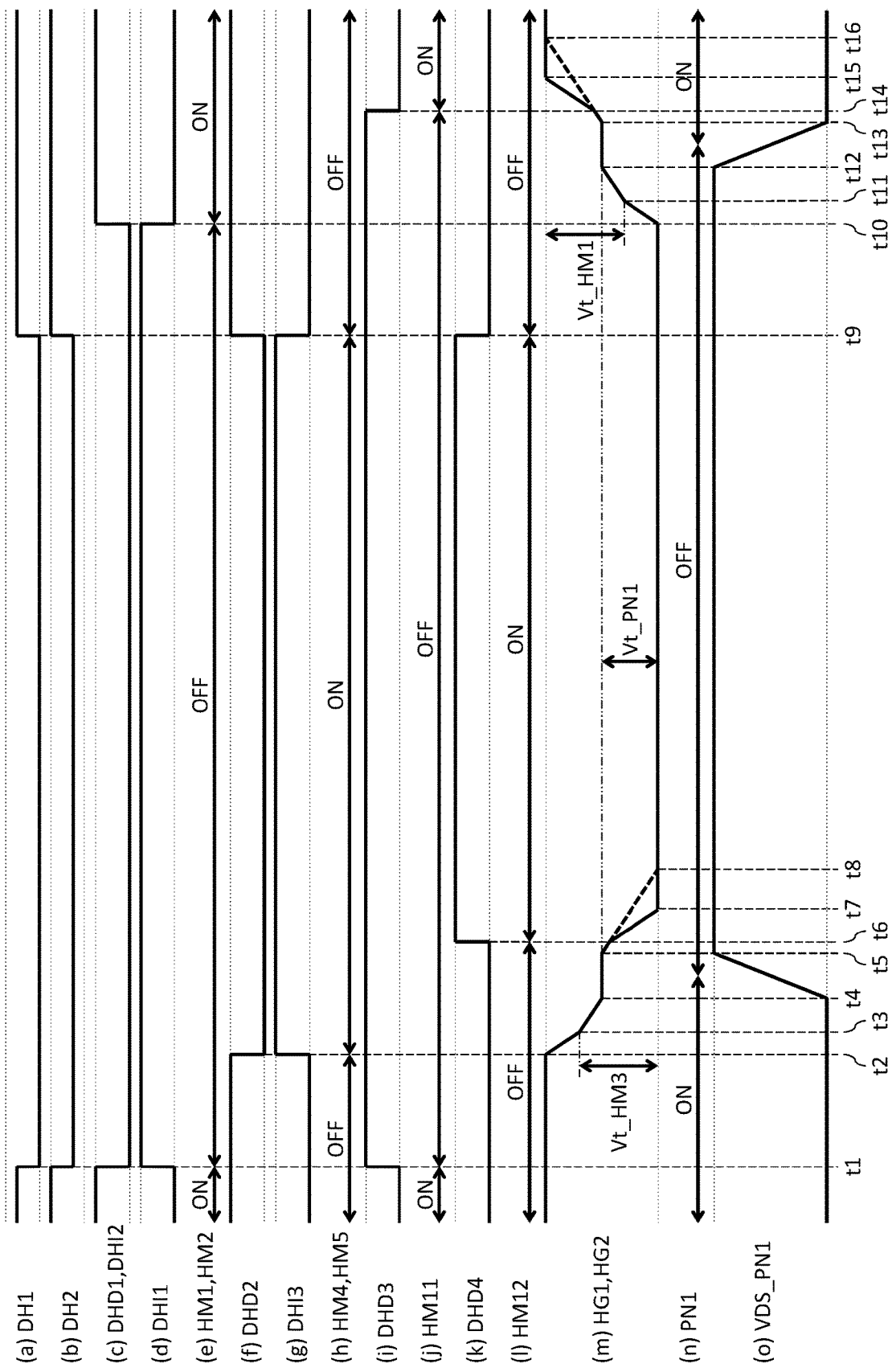
FIG. 7 is a timing chart of a high-side driver circuit in the switching regulator of FIG. 6.

FIG. 7 is a timing chart of the driver circuit HDRV1A in the switching regulator 600 of FIG. 6. The falling edges and rising edges of the signals DH1, DH2, DHD1, DHD2, DHI1, DHI2, DHI3, HM1, HM2, HM4 and HM5 in (a) to (h) of FIG. 7 are substantially the same as those in (a) to (h) of FIG. 4. Therefore, description of these signals is omitted and different signals in (i) to (o) are described below.

(i) DHD3 is an output signal of the delay circuit HDLY3 and is obtained by delaying the signal DHI1 by the delay circuit HDLY3. The delay circuit HDLY3 delays only falling edges of the signal DHI1, for example. Therefore, the signal DHD3 rises at time t1 and falls at time t14, for example.

(j) HM11 shows an on/off state of the transistor HM11. The on/off state of the transistor HM11 depends on a low or high level of the signal DHD3. Therefore, the transistor HM11 is turned off in the interval from time t1 to time t14 and is turned on in other intervals, for example.

(k) DHD4 is an output signal of the delay circuit HDLY4 and is obtained by delaying the signal DHI3 by the delay circuit HDLY4. The delay circuit HDLY4 delays only rising edges of the signal DHI3, for example. Therefore, the signal DHD4 rises at time t6 and falls at time t9, for example.

(l) HM12 shows an on/off state of the transistor HM12. The on/off state of the transistor HM12 depends on a high or low level of the signal DHD4. Therefore, the transistor HM12 is turned on in the interval from time t6 to time t9 and is turned off in other intervals, for example.

(m) HG1 is the high-side gate signal output from the driver circuit HDRV1A, and (m) HG2 is the high-side gate signal input to the gate of the high-side transistor PN1. The waveforms of the high-side gate signals HG1 and HG2 are substantially the same as each other. In other words, it is shown that the high-side gate signals before and after being affected by the parasitic resistance RPHG and the parasitic inductance LPHG have substantially the same waveform. This indicates that such influence of the parasitic components can be suppressed by giving some gradients to falling edges and rising edges of the high-side gate signal HG1 output from the driver circuit HDRV1A.

The high-side gate signals HG1 and HG2 are maintained at high level (=VBOOT) until time t2 when the pull-down circuit HPD1A is turned on, i.e. when the transistors HM4 and HM5 are turned on. The high-side gate signals HG1 and HG2 start to decrease at the first slew rate (gradient) from time t2 and rapidly decrease until time t3 when reaching the threshold value voltage Vt_HM3 of the transistor HM3. After time t3, current hardly flows in the transistors HM3 and HM4, and current restricted by the resistor HR2 flows in the transistor HM5. Therefore, the high-side gate signals HG1 and HG2 start to decrease at the second slew rate having a milder gradient than the first slew rate from time t3 and gradually decrease until time t4 when reaching the threshold value voltage Vt_PN1 of the transistor PN1. The high-side gate signal HG1 is maintained at a constant level in the interval from time t4 to time t5 in which the transistor PN1 is switched from on to off. The interval from time t4 to time t5 is uniquely determined by a resistance of the resistor HR2, i.e. a current value flowing in the transistor HM5, the gate-drain capacitance CPHGD of the transistor PN1, and the gate-source capacitance CPHGS of the same. The high-side gate signals HG1 and HG2 start to decrease again at the second slew rate from time t5 when the on/off transition of the transistor PN1 is completed and gradually decrease until time t6 when the transistor HM12 is turned on. The high-side gate signals HG1 and HG2 start to decrease rapidly again from time t6 and rapidly decrease until time t7 when reaching the switching voltage VSW that is a reference potential of the driver circuit HDRV1A. Therefore, behaviors of the high-side gate signals HG1 and HG2 are mainly determined by the transistors HM3 and HM4 in the interval from time t2 to time t3, are determined by the transistor HM5 in the interval from time t3 to time t6, and are determined by the transistor HM12 in the interval from time t6 to time t7. Note that if the transistor HM12 does not exist, time necessary for the high-side gate signals HG1 and HG2 to reach the switching voltage VSW that is the reference potential of the driver circuit HDRV1A is extended to time t8. In other words, using the driver circuit HDRV1A, time necessary for pulling down can be shortened. Ringing may occur when the transistor HM12 is turned on, but the high-side transistor PN1 is already turned off before the transistor HM12 is turned on, and hence the entire of the switching regulator 600 is hardly affected by the ringing.

The high-side gate signals HG1 and HG2 reach the switching voltage VSW that is the reference potential of the driver circuit HDRV1A at time t7 and are maintained at low level until time t10 when the pull-up circuit HPU1A is turned on, i.e. when the transistors HM1 and HM2 are turned on. The high-side gate signals HG1 and HG2 start to increase at the first slew rate (gradient) from time t10 and rapidly increase until time t11 when reaching a voltage lower than the power supply voltage VBOOT of the driver circuit HDRV1A by the threshold value voltage Vt_HM1 of the transistor HM1. After time t11, current hardly flows in the transistor HM1, and current restricted by the resistor HR1 flows in the transistor HM2. Therefore, the high-side gate signals HG1 and HG2 start to increase at the second slew rate having a milder gradient than the first slew rate from time t11 and gradually increase until time t12 when reaching the threshold value voltage Vt_PN1 of the transistor PN1. The high-side gate signals HG1 and HG2 are maintained at constant levels in the interval from time t12 to time t13 in which the transistor PN1 is switched from off to on. The interval from time t12 to time t13 is uniquely determined by a resistance of the resistor HR1, i.e. a current value flowing in the transistor HM2, the gate-drain capacitance CPHGD of the transistor PN1, and the gate-source capacitance CPHGS of the same. The high-side gate signals HG1 and HG2 start to increase again at the second slew rate from time t13 when the on/off transition of the transistor PN1 is completed and gradually increase until time t14 when the transistor HM11 is turned on. The high-side gate signals HG1 and HG2 start to increase rapidly again from time t14 and rapidly increase until time t15 when reaching the bootstrap voltage VBOOT that is the power supply voltage of the driver circuit HDRV1A. Therefore, behavior of the high-side gate signal HG1 is determined mainly by the transistor HM1 in the interval from time t9 to time t10, is determined by the transistor HM2 in the interval from time t10 to time t14, and is determined by the transistor HM11 in the interval from time t14 to time t15. Note that if the transistor HM11 does not exist, time necessary for the high-side gate signals HG1 and HG2 to reach the bootstrap voltage VBOOT that is the power supply voltage of the driver circuit HDRV1A is extended to time t16. In other words, using the driver circuit HDRV1A, time necessary for pulling up can be shortened. Ringing may occur when the transistor HM11 is turned on, but the high-side transistor PN1 is already turned on before the transistor HM11 is turned on, and hence the entire of the switching regulator 600 is hardly affected by the ringing.

(n) PN1 shows an on/off state of the high-side transistor PN1. The on/off state of the high-side transistor PN1 depends on the high-side gate signal HG2, and it is turned on when the high-side gate signal HG2 is higher than the high-side threshold value voltage Vt_PN1 of the transistor PN1 and is turned off when the high-side gate signal HG2 is lower than the same. Therefore, for example, the high-side transistor PN1 is turned on in the interval before time t4, is switched from on to off in the interval from time t4 to time t5, and is turned off in the interval from time t5 to time t12. Further, it is switched from off to on in the interval from time t12 to time t13 and is turned on in the interval after time t13.

(n) VDS_PN1 is a drain-source voltage of the high-side transistor PN1. The drain-source voltage VDS_PN1 substantially depends on an on/off state of the high-side transistor PN1. Therefore, the drain-source voltage VDS_PN1 is at low level (the high-side transistor PN1 is turned on) in the interval before time t4, switches from low level to high level in the interval from time t4 to time t5, and is at high level (the high-side transistor PN1 is turned off) in the interval from time t5 to time t12. Further, it switches from high level to low level in the interval from time t12 to time t13 and is at low level in the interval after time t13.

Figure 8:
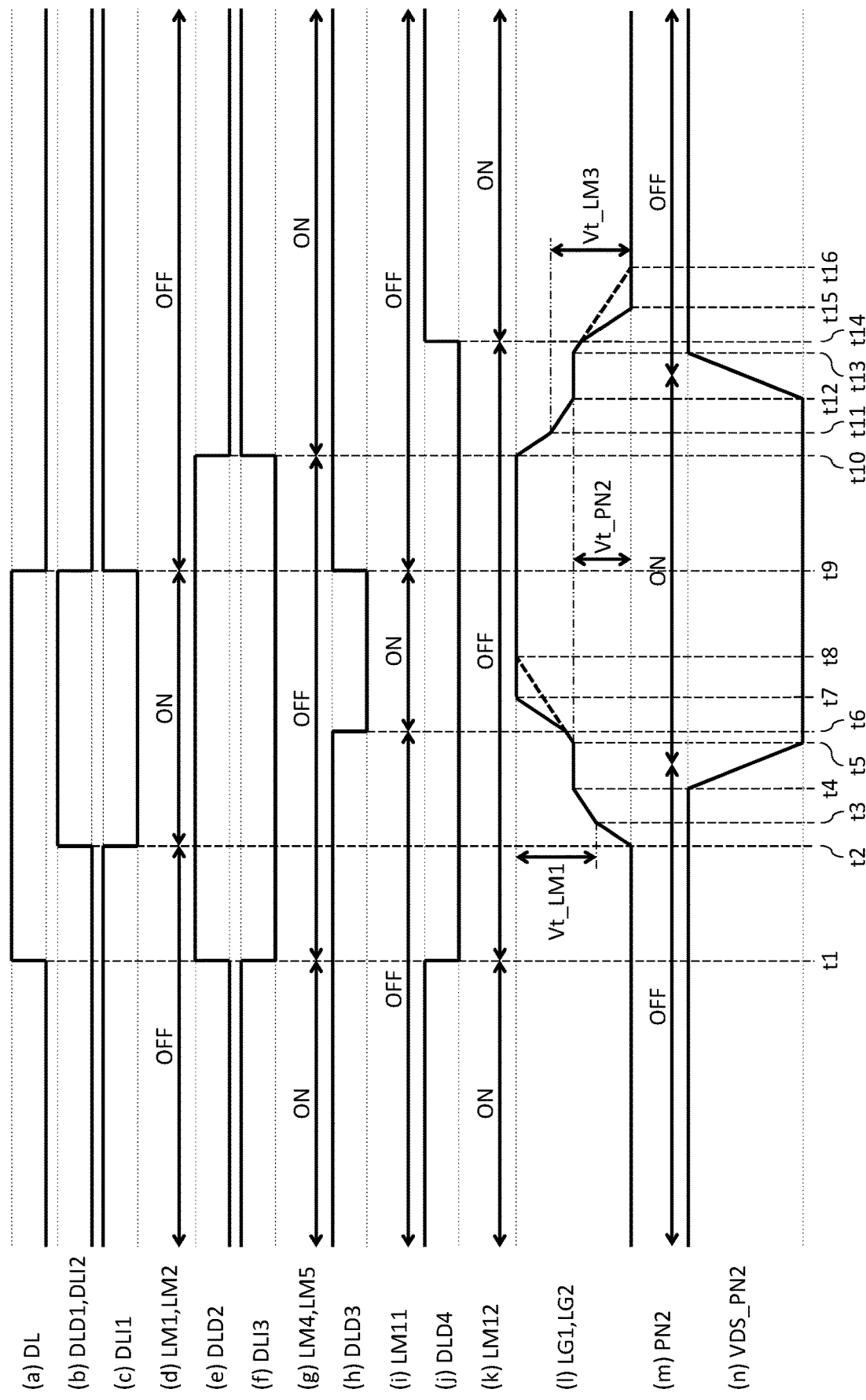
FIG. 8 is a timing chart of a low-side driver circuit in the switching regulator of FIG. 6.

FIG. 8 is a timing chart of the driver circuit LDRV1A in the switching regulator 600 of FIG. 6. The falling edges and rising edges of the signals DL, DLD1, DLD2, DLI1, DLI2, DLI3, LM1, LM2, LM4 and LM5 in (a) to (g) of FIG. 8 are substantially the same as those in (a) to (g) of FIG. 5. Therefore, description of these signals is omitted and different signals in (h) to (n) are described below.

(h) DLD3 is an output signal of a delay circuit LDLY3 and is obtained by delaying the signal DLI1 by the delay circuit LDLY3. The delay circuit LDLY3 delays only falling edges of the signal DLI1, for example. Therefore, the signal DLD3 falls at time t6 and rises at time t9, for example.

(i) LM11 shows an on/off state of the transistor LM11. The on/off state of the transistor LM11 depends on a low or high level of the signal DLD3. Therefore, the transistor LM11 is turned on in the interval from time t6 to time t9 and is turned off in other intervals, for example.

(j) DLD4 is an output signal of a delay circuit LDLY4 and is obtained by delaying the signal DLI3 by the delay circuit LDLY4. The delay circuit LDLY4 delays only rising edges of the signal DLI2. Therefore, the signal DLD4 falls at time t1 and rises at time t14, for example.

(k) LM12 shows an on/off state of the transistor LM12. The on/off state of the transistor LM12 depends on a high or low level of the signal DLD4. Therefore, the transistor LM12 is turned off in the interval from time t1 to time t14 and is turned on in other intervals, for example.

(l) LG1 is a low-side gate signal output from the driver circuit LDRV1A, and (m) LG2 is a low-side gate signal input to the gate of the low-side transistor PN2. The waveforms of the low-side gate signals LG1 and LG2 are substantially the same as each other. In other words, it is shown that the low-side gate signals before and after being affected by the parasitic resistance RPLG and the parasitic inductance LPLG have substantially the same waveform. This indicates that such influence of the parasitic components can be suppressed by giving some gradients to falling edges and rising edges of the low-side gate signal LG1 output from the driver circuit LDRV1A.

The low-side gate signals LG1 and LG2 are maintained at low level (=GND) until time t2 when the pull-up circuit LPU1A is turned on, i.e. when the transistors LM1 and LM2 are turned on. The low-side gate signals LG1 and LG2 start to increase at the first slew rate (gradient) from time t2 and rapidly increase until time t3 when reaching a voltage lower than a power supply voltage VREG of the driver circuit LDRV1A by the threshold value voltage Vt_LM1 of the transistor LM1. After time t3, current hardly flows in the transistor LM1, and current restricted by the resistor LR1 flows in the transistor LM2. Therefore, the low-side gate signals LG1 and LG2 start to increase at the second slew rate having a milder gradient than the first slew rate from time t3 and gradually increase until time t4 when reaching the threshold value voltage Vt_PN2 of the transistor PN2. The low-side gate signals LG1 and LG2 are maintained at a constant level in the interval from time t4 to time t5 in which the transistor PN2 is switched from off to on. The interval from time t4 to time t5 is uniquely determined by a resistance of the resistor LR1, i.e. a current value flowing in the transistor LM2, the gate-drain capacitance CPLGD of the transistor PN2, and the gate-source capacitance CPLGS of the same. The low-side gate signals LG1 and LG2 start to increase again at the second slew rate from time t5 when the on/off transition of the transistor PN2 is completed and gradually increase until time t6 when the transistor LM11 is turned on. The low-side gate signals LG1 and LG2 start to increase rapidly again from time t6 and rapidly increase until time t7 when reaching the power supply voltage VREG of the driver circuit LDRV1A. Therefore, behaviors of the low-side gate signals LG1 and LG2 are determined mainly by the transistor LM1 in the interval from time t2 to time t3, are determined by the transistor LM2 in the interval from time t3 to time t6, and are determined by the transistor LM11 in the interval from time t6 to time t7. Note that if the transistor LM11 does not exist, time necessary for the low-side gate signals LG1 and LG2 to reach the power supply voltage VREG of the driver circuit LDRV1A is extended to time t8. In other words, using the driver circuit LDRV1A, time necessary for pulling up can be shortened.

Ringing may occur when the transistor LM11 is turned on, but the low-side transistor PN2 is already turned on before the transistor LM11 is turned on, and hence the entire of the switching regulator 600 is hardly affected by the ringing.

The low-side gate signals LG1 and LG2 reach the power supply voltage VREG of the driver circuit LDRV1A at time t7 and are maintained at high level (=VREG) until time t10 when the pull-down circuit LPD1A is turned on, i.e. when the transistors LM4 and LM5 are turned on. The low-side gate signals LG1 and LG2 start to decrease at the first slew rate (gradient) from time t10 and rapidly decrease until time t11 when reaching the threshold value voltage Vt_LM3 of the transistor LM3. After time t11, current hardly flows in the transistors LM3 and LM4, and current restricted by a resistor LR2 flows in the transistor LM5. Therefore, the low-side gate signals LG1 and LG2 start to decrease at the second slew rate having a milder gradient than the first slew rate from time t11 and gradually decrease until time t12 when reaching the threshold value voltage Vt_PN2 of the transistor PN2. The low-side gate signals LG1 and LG2 are maintained at a constant level in the interval from time t12 to time t13 in which the transistor PN2 is switched from on to off. The interval from time t12 to time t13 is uniquely determined by a resistance of a resistor LR2, i.e. a current value flowing in the transistor LM5, a gate-drain capacitance CPLGD of the transistor PN2, and a gate-source capacitance CPLGS of the same. The low-side gate signals LG1 and LG2 start to decrease again at the second slew rate from time t13 when the on/off transition of the transistor PN2 is completed and gradually decrease until time t14 when the transistor LM12 is turned on. The low-side gate signals LG1 and LG2 start to decrease rapidly again from time t14 and rapidly decrease until time t15 when reaching the ground potential GND that is a reference potential of the driver circuit LDRV1A. Therefore, behaviors of the low-side gate signals LG1 and LG2 are determined mainly by the transistors LM3 and LM4 in the interval from time t10 to time t11, are determined by the transistor LM5 in the interval from time t11 to time t14, and are determined by the transistor LM12 in the interval from time t14 to time t15. Note that if the transistor LM12 does not exist, time necessary for the low-side gate signals LG1 and LG2 to reach the ground potential GND that is the reference potential of the driver circuit LDRV1A is extended to time t16. In other words, using the driver circuit LDRV1A, time necessary for pulling down can be shortened. Ringing may occur when the transistor LM12 is turned on, but the low-side transistor PN2 is already turned off before the transistor LM12 is turned on, and hence the entire of the switching regulator 600 is hardly affected by the ringing.

(m) PN2 shows an on/off state of the low-side transistor PN2. The on/off state of the low-side transistor PN2 depends on the low-side gate signal LG2, and it is turned on when the low-side gate signal LG2 is higher than the low-side threshold value voltage Vt_PN2 of the transistor PN2 and is turned off when the low-side gate signal LG2 is lower than the same. Therefore, for example, the low-side transistor PN2 is turned off in the interval before time t4, is switched from off to on in the interval from time t4 to time t5, and is turned on in the interval from time t5 to time t12. Further, it is switched from on to off in the interval from time t12 to time t13 and is turned off in the interval after time t13.

(n) VDS_PN2 is a drain-source voltage of the low-side transistor PN2. The drain-source voltage VDS_PN2 substantially depends on an on/off state of the low-side transistor PN2. Therefore, the drain-source voltage VDS_PN2 is at high level (the low-side transistor PN2 is turned off) in the interval before time t4, switches from high level to low level in the interval from time t4 to time t5, and is at low level (the low-side transistor PN2 is turned on) in the interval from time t5 to time t12. Further, it switches from low level to high level in the interval from time t12 to time t13, and is at high level in the interval after time t13.

<Third Embodiment of Switching Regulator>

Figure 9:
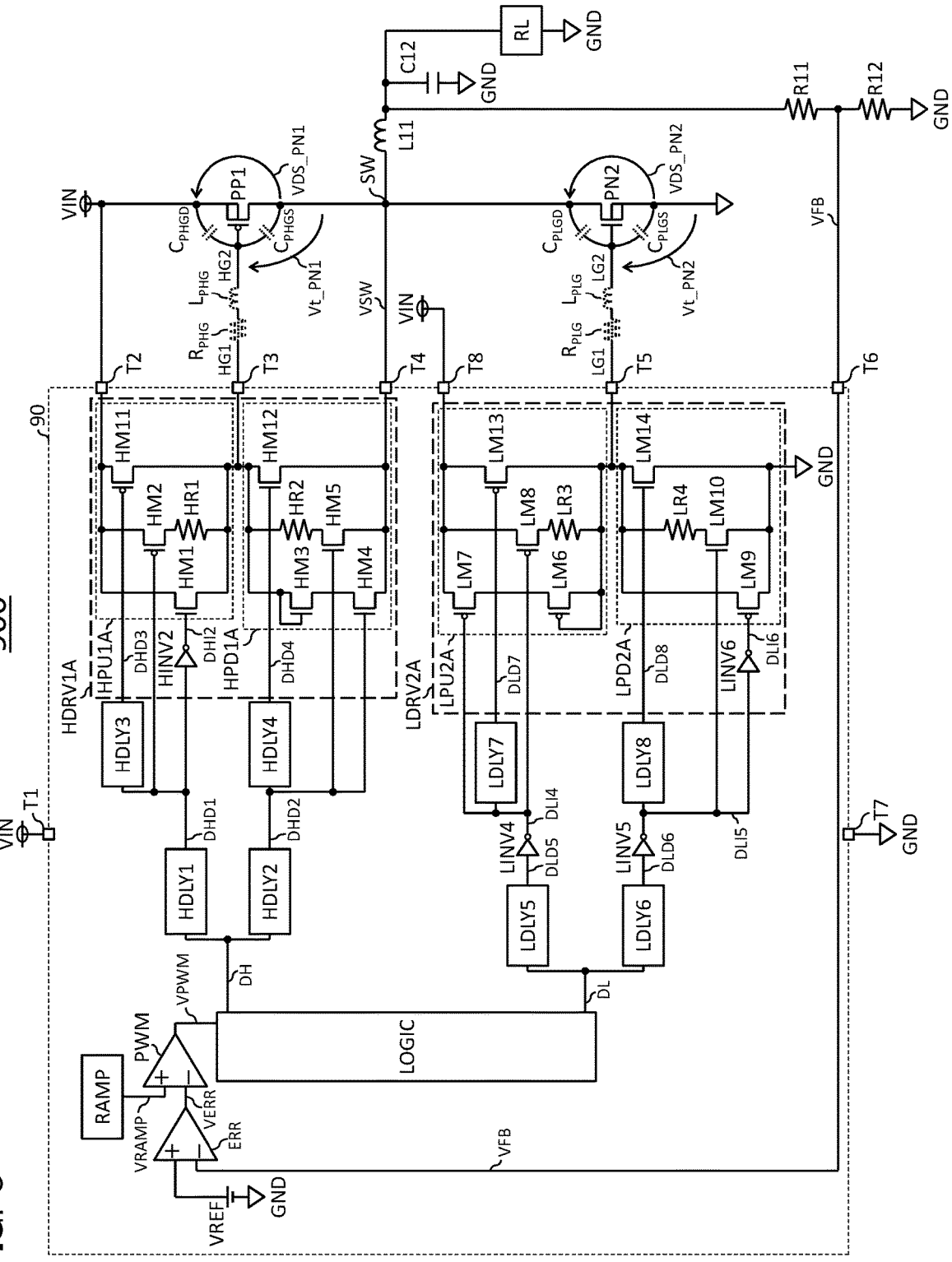
FIG. 9 is a circuit diagram of a third embodiment of the switching regulator using the driver circuit according to the present invention.

FIG. 9 is a circuit diagram illustrating a third embodiment of the switching regulator according to the present invention. Unlike the switching regulator 300 (FIG. 3) or the switching regulator 600 (FIG. 6), a switching regulator 900 of FIG. 9 is a synchronous rectification type step-down DC/DC converter without a bootstrap circuit.

The structure of FIG. 9 is different from that of FIG. 6 in the following points. Firstly as the high-side transistor, the NMOS type transistor PN1 is replaced by a PMOS type transistor PP1. Secondly the level shift circuit LS is not used in a semiconductor device 90. Thirdly the driver circuit LDRV1A is replaced by a driver circuit LDRV2A having a circuit structure based on the driver circuit DRV2 illustrated in FIG. 2. Note that, unlike the driver circuit DRV2 of FIG. 2, in the driver circuit LDRV2A of FIG. 9, a transistor LM13 is added to the pull-up circuit LPU2A, and a transistor LM14 is added to the pull-down circuit LPD2A. Other circuit structures are substantially the same, and hence detailed description is omitted. The driver circuit according to the present invention can be applied to any form of the switching regulator.

<Fourth Embodiment of Switching Regulator>

Figure 10:
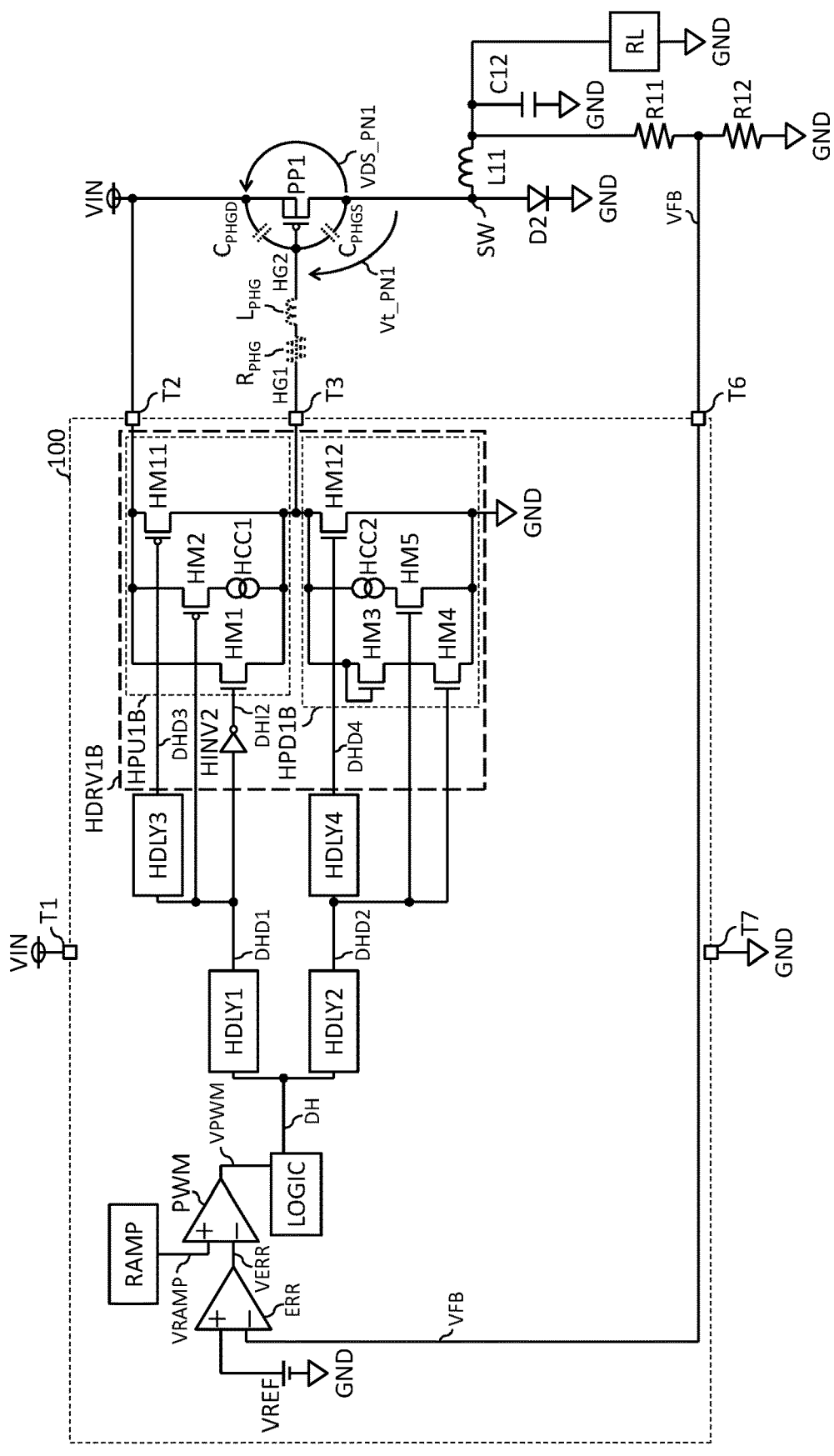
FIG. 10 is a circuit diagram of a fourth embodiment of the switching regulator using the driver circuit according to the present invention.

FIG. 10 is a circuit diagram illustrating a fourth embodiment of the switching regulator according to the present invention. Unlike the synchronous rectification type such as the switching regulator 300 (FIG. 3), the switching regulator 600 (FIG. 6), or the switching regulator 900 (FIG. 9) described above, FIG. 10 illustrates a diode (asynchronous) rectification type step-down DC/DC converter. A switching regulator 1000 does not need the low-side driver so that a structure of the driver circuit can be simplified, and hence it is sufficient to prepare a high-side driver circuit HDRV1B. The driver circuit HDRV1B includes a pull-up circuit HPU1B and a pull-down circuit HPD1B. Note that, as understood from comparison between the pull-up circuit HPU1A and the pull-down circuit HPD1A in FIG. 9, constant current sources HCC1 and HCC2 are used instead of the resistors HR1 and HR2 in the pull-up circuit HPU1B and the pull-down circuit HPD1B in FIG. 10. By setting current values of the constant current sources HCC1 and HCC2, it is possible to provide resistors equivalent to the resistors HR1 and HR2. As the constant current sources HCC1 and HCC2 have smaller current values, a resistance component of the main conductive path becomes larger. On the contrary, as the constant current sources HCC1 and HCC2 have larger current values, the resistance component becomes smaller.

In the above description, the step-down type DC/DC converter is exemplified and described as the switching regulator according to the present invention. However, the driver circuit according to the present invention can be applied not only to the step-down type but also to a step-up type, a step-up-and-down type, or an inverting type switching regulator. Further, it can be used also as a driver circuit of a DC/AC inverter that converts a DC voltage to an AC voltage. In addition, the driver circuit according to the present invention can be applied also to an interface circuit that can reduce noise generated in an output waveform, or a waveform shaping circuit, or a data output buffer circuit of a memory, a microprocessor, or the like.

<Effect>

The driver circuit according to the present invention can suppress occurrence of ringing, because a response speed is made to be a little slow by setting a threshold value voltage of a MOS transistor or the like that is uniquely generated in circuit operation between a first response having a first slew rate and a second response having a second slew rate to an input signal, for example.

INDUSTRIAL APPLICABILITY

As described above, the driver circuit according to the present invention can be applied to wide fields, and has very high industrial applicability.

What is claimed is:

1. A driver circuit comprising a pull-up circuit and a pull-down circuit, arranged to share an output node so as to output an output signal from the output node by on-off operation of complementary input signals, wherein
the pull-up circuit and the pull-down circuit are connected in series between a power supply terminal and a reference potential via the output node, and
at least one of the pull-up circuit and the pull-down circuit responses to each of rising and falling of the input signals with a first response and a second response, wherein time necessary for the second response is set to be longer than time necessary for the first response.

2. The driver circuit according to claim 1, wherein
the pull-up circuit or the pull-down circuit includes MOS type first transistor and second transistor having main conductive paths connected in parallel, and
the first response is made by the first transistor, while the second response is made by the second transistor.

3. The driver circuit according to claim 2, wherein a resistance component of the main conductive path of the second transistor is larger than a resistance component of the main conductive path of the first transistor.

4. The driver circuit according to claim 3, wherein a ratio W/L between a channel width W and a channel length L of the second transistor is set to be smaller than that of the first transistor.

5. The driver circuit according to claim 2, wherein current flowing in the main conductive path of the second transistor is smaller than current flowing in the main conductive path of the first transistor.

6. The driver circuit according to claim 2, wherein a level at which the first response and the second response are switched is a threshold value voltage between gate and source of the first transistor.

7. The driver circuit according to claim 2, further comprising a diode-connected transistor or a diode, wherein
the diode-connected transistor or the diode is connected in series to the first transistor so as to form the main conductive path of the first transistor, and
a level at which the first response and the second response are switched is a threshold value voltage between gate and source of the diode-connected transistor or a threshold value voltage of the diode.

8. The driver circuit according to claim 7, wherein the diode-connected transistor, the first transistor, and the second transistor have the same conductivity type.

9. The driver circuit according to claim 2, wherein the first transistor and the second transistor have opposite conductivity types.

10. The driver circuit according to claim 2, further comprising a third transistor, wherein
the main conductive path of the third transistor is connected in parallel to the main conductive paths of the first transistor and the second transistor, and
the third transistor makes a third response after the first response and the second response.

11. The driver circuit according to claim 1, wherein
the pull-up circuit or the pull-down circuit includes bipolar type first transistor and second transistor having main conductive paths connected in parallel, and
the first response is made by the first transistor, while the second response is made by the second transistor.

12. The driver circuit according to claim 11, wherein a level at which the first response and the second response are switched is a forward voltage between base and emitter.

13. The driver circuit according to claim 1, wherein a dead time is set in which both the pull-up circuit and the pull-down circuit are turned off when operations of the two circuits are switched.

14. A switching regulator comprising:
a switching transistor;
an inductor to which current is supplied when the switching transistor is on-off controlled;
a capacitor arranged to smooth electromagnetic energy stored in the inductor; and
a driver circuit according to claim 1, arranged to perform the on-off control of the switching transistor.

15. The switching regulator according to claim 14, wherein the switching regulator is one of a step-down type, a step-up type, a step-up-and-down type, and an inverting type.

16. The switching regulator according to claim 15, wherein the switching regulator is a DC/DC converter or a DC/AC inverter.

17. A driver circuit comprising a pull-up circuit and a pull-down circuit, arranged to share an output node so as to output an output signal from the output node by on-off operation of complementary input signals, wherein
the pull-up circuit and the pull-down circuit are connected in series between a power supply terminal and a reference potential via the output node, and
at least one of the pull-up circuit and the pull-down circuit responses to each of rising and falling of the input signals with a first response and a second response, wherein a dead time is set in which both the pull-up circuit and the pull-down circuit are turned off when operations of the two circuits are switched.

18. A switching regulator comprising:
a switching transistor;
an inductor to which current is supplied when the switching transistor is on-off controlled;
a capacitor arranged to smooth electromagnetic energy stored in the inductor; and
a driver circuit arranged to perform the on-off control of the switching transistor, wherein
the driver circuit comprises a pull-up circuit and a pull-down circuit, arranged to share an output node so as to output an output signal from the output node by on-off operation of complementary input signals, wherein
the pull-up circuit and the pull-down circuit are connected in series between a power supply terminal and a reference potential via the output node, and
at least one of the pull-up circuit and the pull-down circuit responses to each of rising and falling of the input signals with a first response and a second response.

* * * * *